(12) United States Patent
Duong et al.

(10) Patent No.: US 7,968,896 B2
(45) Date of Patent: *Jun. 28, 2011

(54) SEPARATE OPTICAL DEVICE FOR DIRECTING LIGHT FROM AN LED

(75) Inventors: Dung T. Duong, Cedar Park, TX (US); Paul N. Winberg, Rollingwood, TX (US); Matthew R. Thomas, Austin, TX (US)

(73) Assignee: Illumitex, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/788,094

(22) Filed: May 26, 2010

(65) Prior Publication Data

US 2010/0284167 A1     Nov. 11, 2010

Related U.S. Application Data

(63) Continuation of application No. 11/649,018, filed on Jan. 3, 2007, now Pat. No. 7,772,604.

(60) Provisional application No. 60/756,845, filed on Jan. 5, 2006.

(51) Int. Cl.
    *H01L 33/00* (2010.01)
(52) U.S. Cl. ............ 257/95; 257/96; 257/E33.058
(58) Field of Classification Search ............ 257/95, 257/98, E33.058
    See application file for complete search history.

(56) References Cited

U.S. PATENT DOCUMENTS

| | | |
|---|---|---|
| 1,670,837 A | 5/1828 | Blackmore |
| 3,981,023 A | 9/1976 | King et al. |
| 3,988,633 A | 10/1976 | Shurgan et al. |
| 4,125,890 A | 11/1978 | Nixon, Jr. |
| 4,180,755 A | 12/1979 | Nixon, Jr. |
| 4,239,369 A | 12/1980 | English et al. |
| 4,304,479 A | 12/1981 | Van Allen |
| 4,388,633 A | 6/1983 | Vasudev |
| 4,439,910 A | 4/1984 | Vasudev |
| 4,486,364 A | 12/1984 | Takahashi |

(Continued)

FOREIGN PATENT DOCUMENTS

EP        1 380 469 A2      1/2004

(Continued)

OTHER PUBLICATIONS

International Search Report and Written Opinion, International Patent Application No. PCT/US07/00102 mailed Mar. 28, 2008, 10 pgs.

(Continued)

*Primary Examiner* — Phat X Cao
(74) *Attorney, Agent, or Firm* — Sprinkle IP Law Group

(57) ABSTRACT

Embodiments of the present invention provide separate optical devices operable to couple to a separate LED, the separate optical device comprising an entrance surface to receive light from a separate LED when the separate optical device is coupled to the separate LED, an exit surface opposite from and a distance from the entrance surface and a set of sidewalls. The exit surface can have at least a minimum area necessary to conserve brightness for a desired half-angle of light projected from the separate optical device. Furthermore, each sidewall is positioned and shaped so that rays having a straight transmission path from the entrance surface to that sidewall reflect to the exit surface with an angle of incidence at the exit surface at less than or equal to a critical angle at the exit surface.

20 Claims, 10 Drawing Sheets

U.S. PATENT DOCUMENTS

| | | |
|---|---|---|
| 4,501,637 A | 2/1985 | Mitchell et al. |
| 4,716,507 A | 12/1987 | Ames |
| 4,728,999 A | 3/1988 | Dannatt et al. |
| 4,740,259 A | 4/1988 | Heinen |
| 4,799,136 A | 1/1989 | Molnar |
| 4,841,344 A | 6/1989 | Heinen |
| 4,966,862 A | 10/1990 | Edmond |
| 5,036,339 A | 7/1991 | Hediger |
| 5,087,949 A | 2/1992 | Haitz |
| 5,114,513 A | 5/1992 | Hosokawa |
| 5,126,929 A | 6/1992 | Cheselske |
| 5,151,718 A | 9/1992 | Nelson |
| 5,174,649 A | 12/1992 | Alston |
| 5,218,216 A | 6/1993 | Manabe et al. |
| 5,233,204 A | 8/1993 | Fletcher et al. |
| 5,251,117 A | 10/1993 | Nagai |
| 5,272,108 A | 12/1993 | Kozawa et al. |
| 5,278,433 A | 1/1994 | Manabe et al. |
| 5,281,830 A | 1/1994 | Kotaki et al. |
| 5,315,490 A | 5/1994 | Bastable |
| 5,369,289 A | 11/1994 | Tamaki et al. |
| 5,523,591 A | 6/1996 | Fleming et al. |
| 5,528,720 A | 6/1996 | Winston |
| 5,563,422 A | 10/1996 | Nakamura et al. |
| 5,578,156 A | 11/1996 | Kamakura et al. |
| 5,587,593 A | 12/1996 | Koide et al. |
| 5,620,557 A | 4/1997 | Manabe et al. |
| 5,652,438 A | 7/1997 | Sassa et al. |
| 5,654,831 A | 8/1997 | Byren et al. |
| 5,667,297 A | 9/1997 | Maassen |
| 5,700,713 A | 12/1997 | Yamazaki et al. |
| 5,739,554 A | 4/1998 | Edmond et al. |
| 5,780,867 A | 7/1998 | Fritz et al. |
| 5,790,583 A | 8/1998 | Ho |
| 5,813,753 A | 9/1998 | Vriens et al. |
| 5,839,424 A | 11/1998 | Hauser |
| 5,846,844 A | 12/1998 | Akasaki et al. |
| 5,862,167 A | 1/1999 | Sassa et al. |
| 5,912,477 A | 6/1999 | Negley |
| 5,945,689 A | 8/1999 | Koike et al. |
| 5,953,469 A | 9/1999 | Zhou |
| 5,959,401 A | 9/1999 | Asami et al. |
| 5,998,925 A | 12/1999 | Shimizu et al. |
| 6,005,722 A | 12/1999 | Butterworth et al. |
| 6,008,539 A | 12/1999 | Shibata et al. |
| 6,023,076 A | 2/2000 | Shibata |
| 6,066,861 A | 5/2000 | Hohn et al. |
| 6,078,064 A | 6/2000 | Ming-Jiunn et al. |
| 6,093,941 A | 7/2000 | Russell |
| 6,118,908 A | 9/2000 | Bischel |
| 6,133,589 A | 10/2000 | Krames |
| 6,144,536 A | 11/2000 | Zimmerman |
| 6,169,294 B1 | 1/2001 | Biing-Jye et al. |
| 6,177,761 B1 | 1/2001 | Pelka et al. |
| 6,185,051 B1 | 2/2001 | Chen et al. |
| 6,194,742 B1 | 2/2001 | Kern et al. |
| 6,201,262 B1 | 3/2001 | Edmond et al. |
| 6,221,683 B1 | 4/2001 | Nirschl et al. |
| 6,222,207 B1 | 4/2001 | Carter-Coman et al. |
| 6,229,160 B1 | 5/2001 | Krames |
| 6,229,782 B1 | 5/2001 | Wang et al. |
| 6,257,737 B1 | 7/2001 | Marshall et al. |
| 6,258,618 B1 | 7/2001 | Lester |
| 6,271,622 B1 | 8/2001 | Coushaine et al. |
| 6,274,924 B1 | 8/2001 | Carey et al. |
| 6,287,947 B1 | 9/2001 | Ludowise et al. |
| 6,307,218 B1 | 10/2001 | Steigerwald et al. |
| 6,310,364 B1 | 10/2001 | Uemura |
| 6,323,063 B2 | 11/2001 | Krames |
| 6,331,450 B1 | 12/2001 | Uemura |
| 6,335,999 B1 | 1/2002 | Winston |
| 6,337,493 B1 | 1/2002 | Tanizawa et al. |
| D453,745 S | 2/2002 | Suenaga |
| 6,350,041 B1 | 2/2002 | Tarsa et al. |
| 6,351,069 B1 | 2/2002 | Lowery et al. |
| 6,356,700 B1 | 3/2002 | Strobl |
| 6,361,192 B1 | 3/2002 | Fussell et al. |
| 6,364,487 B1 | 4/2002 | Weber et al. |
| 6,377,535 B1 | 4/2002 | Chen et al. |
| 6,410,942 B1 | 6/2002 | Thibeault |
| 6,417,019 B1 | 7/2002 | Mueller et al. |
| 6,443,594 B1 | 9/2002 | Marshall et al. |
| 6,445,011 B1 | 9/2002 | Hirano et al. |
| 6,452,214 B2 | 9/2002 | Kaneyama et al. |
| 6,459,100 B1 | 10/2002 | Doverspike et al. |
| 6,478,453 B2 | 11/2002 | Lammers et al. |
| 6,486,499 B1 | 11/2002 | Krames et al. |
| 6,489,636 B1 | 12/2002 | Goetz et al. |
| 6,501,102 B2 | 12/2002 | Mueller-Mach et al. |
| 6,502,956 B1 | 1/2003 | Wu |
| 6,504,171 B1 | 1/2003 | Grillot et al. |
| 6,504,179 B1 | 1/2003 | Ellens et al. |
| 6,514,782 B1 | 2/2003 | Wierer, Jr. et al. |
| 6,515,313 B1 | 2/2003 | Ibbetson et al. |
| 6,526,082 B1 | 2/2003 | Corzine et al. |
| 6,526,201 B1 | 2/2003 | Mrakovich et al. |
| 6,527,411 B1 | 3/2003 | Sayers |
| 6,534,797 B1 | 3/2003 | Edmond et al. |
| 6,541,800 B2 | 4/2003 | Barnett et al. |
| 6,547,416 B2 | 4/2003 | Pashley et al. |
| 6,547,423 B2 | 4/2003 | Marshall |
| 6,563,142 B2 | 5/2003 | Shen et al. |
| 6,570,190 B2 | 5/2003 | Krames |
| 6,573,537 B1 | 6/2003 | Steigerwald et al. |
| 6,576,488 B2 | 6/2003 | Collins, III et al. |
| 6,576,932 B2 | 6/2003 | Khare et al. |
| D477,579 S | 7/2003 | Suenaga |
| D477,580 S | 7/2003 | Kamada |
| 6,598,998 B2 | 7/2003 | West |
| D478,877 S | 8/2003 | Hoshiba |
| 6,603,243 B2 | 8/2003 | Parkyn et al. |
| 6,603,258 B1 | 8/2003 | Mueller-Mach et al. |
| 6,608,330 B1 | 8/2003 | Yamada |
| 6,610,598 B2 | 8/2003 | Chen |
| 6,620,643 B1 | 9/2003 | Koike et al. |
| 6,623,142 B1 | 9/2003 | Lippmann et al. |
| 6,630,689 B2 | 10/2003 | Bhat et al. |
| 6,630,691 B1 | 10/2003 | Mueller-Mach et al. |
| 6,630,692 B2 | 10/2003 | Goetz et al. |
| 6,635,503 B2 | 10/2003 | Andrews et al. |
| 6,635,904 B2 | 10/2003 | Goetz et al. |
| 6,637,921 B2 | 10/2003 | Coushaine |
| 6,639,733 B2 | 10/2003 | Minano |
| D482,337 S | 11/2003 | Kamada |
| D482,666 S | 11/2003 | Kamada |
| 6,642,618 B2 | 11/2003 | Yagi et al. |
| 6,642,652 B2 | 11/2003 | Collins, III et al. |
| 6,649,440 B1 | 11/2003 | Krames et al. |
| 6,649,943 B2 | 11/2003 | Shibata et al. |
| 6,649,946 B2 | 11/2003 | Bogner et al. |
| 6,650,044 B1 | 11/2003 | Lowery |
| 6,657,236 B1 | 12/2003 | Thibeault |
| 6,657,300 B2 | 12/2003 | Goetz et al. |
| 6,664,560 B2 | 12/2003 | Emerson et al. |
| 6,671,452 B2 | 12/2003 | Winston |
| 6,679,621 B2 | 1/2004 | West et al. |
| 6,680,490 B2 | 1/2004 | Yasukawa et al. |
| 6,680,569 B2 | 1/2004 | Mueller-Mach et al. |
| 6,682,207 B2 | 1/2004 | Weber et al. |
| 6,682,331 B1 | 1/2004 | Peh |
| 6,683,327 B2 | 1/2004 | Krames et al. |
| 6,686,691 B1 | 2/2004 | Mueller et al. |
| 6,696,703 B2 | 2/2004 | Mueller-Mach et al. |
| 6,711,200 B1 | 3/2004 | Scherer |
| 6,717,353 B2 | 4/2004 | Mueller et al. |
| 6,717,355 B2 | 4/2004 | Takahashi et al. |
| D489,690 S | 5/2004 | Ishida |
| D490,387 S | 5/2004 | Yagi |
| 6,730,939 B2 | 5/2004 | Eisert et al. |
| 6,730,940 B1 | 5/2004 | Steranka |
| 6,734,467 B2 | 5/2004 | Schlereth et al. |
| 6,737,681 B2 | 5/2004 | Koda |
| 6,738,175 B2 | 5/2004 | Morita et al. |
| 6,740,906 B2 | 5/2004 | Slater, Jr. et al. |
| D490,782 S | 6/2004 | Suenaga |
| D490,784 S | 6/2004 | Ishida |
| D491,538 S | 6/2004 | Ishida |

| Patent | Kind | Date | Name |
|---|---|---|---|
| D491,899 | S | 6/2004 | Yagi |
| 6,744,071 | B2 | 6/2004 | Sano et al. |
| 6,744,077 | B2 | 6/2004 | Trottier et al. |
| 6,746,124 | B2 | 6/2004 | Fischer et al. |
| 6,746,295 | B2 | 6/2004 | Sorg |
| 6,747,298 | B2 | 6/2004 | Slater, Jr. et al. |
| 6,759,803 | B2 | 7/2004 | Sorg |
| 6,764,932 | B2 | 7/2004 | Kong et al. |
| 6,768,136 | B2 | 7/2004 | Eisert et al. |
| 6,768,525 | B2 | 7/2004 | Paolini |
| 6,774,405 | B2 | 8/2004 | Yasukawa et al. |
| 6,777,871 | B2 | 8/2004 | Duggal |
| 6,784,027 | B2 | 8/2004 | Streubel et al. |
| D495,822 | S | 9/2004 | Yoneda |
| D496,007 | S | 9/2004 | Hoshiba |
| 6,791,103 | B2 | 9/2004 | Nakamura et al. |
| 6,791,116 | B2 | 9/2004 | Takahashi et al. |
| 6,791,119 | B2 | 9/2004 | Slater |
| 6,794,211 | B2 | 9/2004 | Oh |
| 6,794,684 | B2 | 9/2004 | Slater, Jr. et al. |
| 6,794,690 | B2 | 9/2004 | Uemura |
| D497,349 | S | 10/2004 | Hoshiba |
| 6,800,500 | B2 | 10/2004 | Coman |
| 6,800,876 | B2 | 10/2004 | Edmond et al. |
| 6,806,571 | B2 | 10/2004 | Shibata et al. |
| 6,812,053 | B1 | 11/2004 | Kong et al. |
| 6,812,500 | B2 | 11/2004 | Reeh et al. |
| 6,814,470 | B2 | 11/2004 | Rizkin et al. |
| 6,819,505 | B1 | 11/2004 | Cassarly |
| 6,819,506 | B1 | 11/2004 | Taylor |
| 6,821,804 | B2 | 11/2004 | Thibeault |
| 6,825,501 | B2 | 11/2004 | Edmond et al. |
| D499,384 | S | 12/2004 | Kamada |
| D499,385 | S | 12/2004 | Ishida |
| 6,828,596 | B2 | 12/2004 | Steigerwald et al. |
| 6,828,599 | B2 | 12/2004 | Kim |
| 6,831,302 | B2 | 12/2004 | Erchak |
| 6,831,305 | B2 | 12/2004 | Yasukawa et al. |
| 6,833,564 | B2 | 12/2004 | Shen et al. |
| 6,835,957 | B2 | 12/2004 | Stockman |
| 6,838,705 | B1 | 1/2005 | Tanizawa |
| 6,841,931 | B2 | 1/2005 | Takahashi et al. |
| 6,844,565 | B2 | 1/2005 | Lell et al. |
| 6,844,903 | B2 | 1/2005 | Mueller-Mach et al. |
| 6,846,101 | B2 | 1/2005 | Coushaine |
| 6,847,057 | B1 | 1/2005 | Gardner et al. |
| 6,850,002 | B2 | 2/2005 | Danielson et al. |
| 6,853,010 | B2 | 2/2005 | Slater |
| D502,449 | S | 3/2005 | Ishida |
| D503,388 | S | 3/2005 | Ishida |
| 6,870,191 | B2 | 3/2005 | Niki et al. |
| 6,870,311 | B2 | 3/2005 | Mueller et al. |
| 6,871,982 | B2 | 3/2005 | Holman |
| 6,872,986 | B2 | 3/2005 | Fukuda et al. |
| 6,876,008 | B2 | 4/2005 | Bhat et al. |
| 6,876,009 | B2 | 4/2005 | Narukawa et al. |
| 6,877,558 | B2 | 4/2005 | Connell et al. |
| 6,878,973 | B2 | 4/2005 | Lowery et al. |
| 6,885,033 | B2 | 4/2005 | Andrews |
| 6,885,036 | B2 | 4/2005 | Tarsa |
| 6,888,997 | B2 | 5/2005 | Duong |
| 6,890,085 | B2 | 5/2005 | Hacker |
| 6,891,199 | B2 | 5/2005 | Baur et al. |
| 6,896,381 | B2 | 5/2005 | Benitez |
| 6,897,488 | B2 | 5/2005 | Baur et al. |
| 6,897,490 | B2 | 5/2005 | Brunner et al. |
| 6,900,472 | B2 | 5/2005 | Kondoh et al. |
| 6,900,474 | B2 | 5/2005 | Misra et al. |
| D506,449 | S | 6/2005 | Hoshiba |
| 6,903,376 | B2 | 6/2005 | Shen et al. |
| 6,906,352 | B2 | 6/2005 | Edmond et al. |
| 6,911,676 | B2 | 6/2005 | Yoo |
| 6,916,748 | B2 | 7/2005 | Huang |
| 6,917,059 | B2 | 7/2005 | Uemura |
| 6,921,928 | B2 | 7/2005 | Sonobe |
| 6,924,514 | B2 | 8/2005 | Suenaga |
| 6,924,596 | B2 | 8/2005 | Sato et al. |
| 6,925,100 | B2 | 8/2005 | Senda et al. |
| 6,936,859 | B1 | 8/2005 | Uemura et al. |
| 6,936,860 | B2 | 8/2005 | Sung et al. |
| 6,943,128 | B2 | 9/2005 | Chiyo et al. |
| 6,943,380 | B2 | 9/2005 | Ota et al. |
| 6,943,381 | B2 | 9/2005 | Gardner et al. |
| 6,943,433 | B2 | 9/2005 | Kamada |
| 6,946,682 | B2 | 9/2005 | Slater, Jr. et al. |
| 6,946,685 | B1 | 9/2005 | Steigerwald et al. |
| D510,913 | S | 10/2005 | Sumitani |
| 6,952,024 | B2 | 10/2005 | Edmond et al. |
| 6,953,952 | B2 | 10/2005 | Asakawa |
| 6,955,933 | B2 | 10/2005 | Bour et al. |
| 6,956,245 | B2 | 10/2005 | Senda et al. |
| 6,956,247 | B1 | 10/2005 | Stockman |
| 6,958,497 | B2 | 10/2005 | Emerson et al. |
| 6,960,878 | B2 | 11/2005 | Sakano et al. |
| 6,967,116 | B2 | 11/2005 | Negley |
| 6,969,946 | B2 | 11/2005 | Steranka |
| 6,972,438 | B2 | 12/2005 | Li |
| 6,977,396 | B2 | 12/2005 | Shen et al. |
| 6,987,281 | B2 | 1/2006 | Edmond et al. |
| 6,987,287 | B2 | 1/2006 | Liu et al. |
| 6,987,613 | B2 | 1/2006 | Pocius |
| 6,989,555 | B2 | 1/2006 | Goetz et al. |
| 6,992,334 | B1 | 1/2006 | Wierer, Jr. et al. |
| 6,993,242 | B2 | 1/2006 | Winston |
| 6,995,032 | B2 | 2/2006 | Bruhns et al. |
| 6,998,771 | B2 | 2/2006 | Debray et al. |
| 7,001,058 | B2 | 2/2006 | Inditsky |
| 7,002,291 | B2 | 2/2006 | Ellens et al. |
| 7,005,679 | B2 | 2/2006 | Tarsa et al. |
| 7,005,681 | B2 | 2/2006 | Bader et al. |
| 7,005,684 | B2 | 2/2006 | Uemura et al. |
| 7,009,008 | B1 | 3/2006 | Hohn et al. |
| 7,009,199 | B2 | 3/2006 | Hall |
| 7,009,213 | B2 | 3/2006 | Camras |
| 7,009,218 | B2 | 3/2006 | Sugimoto et al. |
| 7,012,279 | B2 | 3/2006 | Wierer Jr. et al. |
| 7,012,281 | B2 | 3/2006 | Tsai et al. |
| 7,015,054 | B2 | 3/2006 | Steigerwald et al. |
| 7,015,513 | B2 | 3/2006 | Hsieh |
| 7,015,516 | B2 | 3/2006 | Eliashevich |
| 7,018,915 | B2 | 3/2006 | Shibata et al. |
| 7,021,797 | B2 | 4/2006 | Minano |
| 7,026,653 | B2 | 4/2006 | Sun |
| 7,029,935 | B2 | 4/2006 | Negley et al. |
| 7,029,939 | B2 | 4/2006 | Chiyo et al. |
| 7,030,423 | B2 | 4/2006 | Chang et al. |
| 7,037,741 | B2 | 5/2006 | Tasi et al. |
| 7,038,246 | B2 | 5/2006 | Uemura |
| 7,038,370 | B2 | 5/2006 | Mueller-Mach et al. |
| 7,040,774 | B2 | 5/2006 | Beeson |
| 7,042,012 | B2 | 5/2006 | Senda et al. |
| 7,042,153 | B2 | 5/2006 | Uemura |
| 7,045,956 | B2 | 5/2006 | Braune et al. |
| 7,053,417 | B2 | 5/2006 | Kim |
| 7,053,419 | B1 | 5/2006 | Camras |
| 7,063,807 | B2 | 6/2006 | Kummer et al. |
| 7,064,353 | B2 | 6/2006 | Bhat |
| 7,064,355 | B2 | 6/2006 | Camras |
| 7,064,480 | B2 | 6/2006 | Bokor et al. |
| 7,070,300 | B2 | 7/2006 | Harbers et al. |
| 7,071,494 | B2 | 7/2006 | Steigerwald |
| 7,071,495 | B2 | 7/2006 | Uemura |
| 7,072,096 | B2 | 7/2006 | Holman |
| 7,074,631 | B2 | 7/2006 | Erchak |
| 7,075,610 | B2 | 7/2006 | Scalora |
| 7,078,254 | B2 | 7/2006 | Loh |
| 7,078,732 | B1 | 7/2006 | Reeh et al. |
| 7,078,738 | B2 | 7/2006 | Nawashiro et al. |
| 7,080,932 | B2 | 7/2006 | Keuper |
| 7,083,993 | B2 | 8/2006 | Erchak |
| 7,087,738 | B2 | 8/2006 | Botstein et al. |
| 7,087,931 | B2 | 8/2006 | Wu et al. |
| 7,087,936 | B2 | 8/2006 | Negley |
| 7,091,656 | B2 | 8/2006 | Murazaki et al. |
| 7,095,765 | B2 | 8/2006 | Liu et al. |
| 7,098,588 | B2 | 8/2006 | Jager et al. |
| 7,105,857 | B2 | 9/2006 | Nagahama et al. |
| 7,106,090 | B2 | 9/2006 | Harle et al. |

| | | |
|---|---|---|
| 7,108,386 B2 | 9/2006 | Jacobson |
| 7,109,521 B2 | 9/2006 | Hallin |
| 7,109,529 B2 | 9/2006 | Uemura et al. |
| 7,111,964 B2 | 9/2006 | Suehiro et al. |
| 7,112,636 B2 | 9/2006 | Okada |
| 7,122,839 B2 | 10/2006 | Shen et al. |
| 7,132,695 B2 | 11/2006 | Ou et al. |
| 7,132,786 B1 | 11/2006 | Debray et al. |
| 7,138,662 B2 | 11/2006 | Uemura |
| 7,153,015 B2 | 12/2006 | Brukilacchio |
| 7,154,121 B2 | 12/2006 | Hsieh et al. |
| 7,154,149 B2 | 12/2006 | Wu et al. |
| D534,505 S | 1/2007 | Kamada |
| 7,157,294 B2 | 1/2007 | Uemura et al. |
| 7,161,187 B2 | 1/2007 | Suehiro et al. |
| 7,161,301 B2 | 1/2007 | Hsieh et al. |
| 7,170,097 B2 | 1/2007 | Edmond et al. |
| D536,672 S | 2/2007 | Asakawa |
| D537,047 S | 2/2007 | Asakawa |
| 7,183,586 B2 | 2/2007 | Ichihara et al. |
| 7,183,632 B2 | 2/2007 | Arndt |
| 7,183,661 B2 | 2/2007 | Bogner et al. |
| 7,192,797 B2 | 3/2007 | Tu et al. |
| 7,193,299 B2 | 3/2007 | Arndt et al. |
| 7,196,359 B2 | 3/2007 | Baur et al. |
| 7,201,495 B2 | 4/2007 | Epstein |
| 7,202,181 B2 | 4/2007 | Negley |
| 7,211,832 B2 | 5/2007 | Hirose |
| 7,211,833 B2 | 5/2007 | Slater, Jr. et al. |
| 7,211,835 B2 | 5/2007 | Ono |
| 7,215,074 B2 | 5/2007 | Shimuzu et al. |
| 7,217,583 B2 | 5/2007 | Negley et al. |
| 7,227,190 B2 | 6/2007 | Yasukawa et al. |
| 7,227,191 B2 | 6/2007 | Eberhard et al. |
| D547,736 S | 7/2007 | Kamada |
| 7,244,968 B2 | 7/2007 | Yoo |
| 7,247,257 B2 | 7/2007 | Murazaki et al. |
| 7,247,884 B2 | 7/2007 | Shibata et al. |
| 7,247,940 B2 | 7/2007 | Hofer et al. |
| 7,250,715 B2 | 7/2007 | Mueller et al. |
| 7,253,450 B2 | 8/2007 | Senda et al. |
| 7,253,451 B2 | 8/2007 | Yoo et al. |
| 7,256,428 B2 | 8/2007 | Braune et al. |
| 7,256,468 B2 | 8/2007 | Suenaga |
| 7,256,483 B2 | 8/2007 | Epler et al. |
| 7,258,816 B2 | 8/2007 | Tamaki et al. |
| 7,259,033 B2 | 8/2007 | Slater, Jr. et al. |
| 7,259,402 B2 | 8/2007 | Edmond et al. |
| 7,264,527 B2 | 9/2007 | Bawendi et al. |
| 7,265,392 B2 | 9/2007 | Hahn et al. |
| 7,268,371 B2 | 9/2007 | Krames et al. |
| 7,274,040 B2 | 9/2007 | Sun |
| 7,279,346 B2 | 10/2007 | Andrews et al. |
| 7,279,723 B2 | 10/2007 | Matsumura et al. |
| 7,279,724 B2 | 10/2007 | Collins, III et al. |
| 7,280,288 B2 | 10/2007 | Loh et al. |
| 7,282,744 B2 | 10/2007 | Flynn et al. |
| 7,288,797 B2 | 10/2007 | Deguchi et al. |
| 7,291,529 B2 | 11/2007 | Slater, Jr. et al. |
| 7,291,865 B2 | 11/2007 | Kojima et al. |
| 7,294,866 B2 | 11/2007 | Liu |
| D557,224 S | 12/2007 | Kamada |
| 7,319,247 B2 | 1/2008 | Bader et al. |
| 7,319,289 B2 | 1/2008 | Suehiro et al. |
| 7,326,583 B2 | 2/2008 | Andrews et al. |
| 7,326,967 B2 | 2/2008 | Hsieh et al. |
| 7,329,587 B2 | 2/2008 | Bruederl et al. |
| 7,329,905 B2 | 2/2008 | Ibbetson et al. |
| 7,332,365 B2 | 2/2008 | Nakamura et al. |
| 7,335,522 B2 | 2/2008 | Wang et al. |
| 7,335,920 B2 | 2/2008 | Denbaars et al. |
| 7,338,822 B2 | 3/2008 | Wu et al. |
| 7,341,878 B2 | 3/2008 | Krames et al. |
| 7,344,902 B2 | 3/2008 | Basin et al. |
| 7,345,297 B2 | 3/2008 | Yamazoe et al. |
| 7,345,313 B2 | 3/2008 | Strauss et al. |
| 7,345,413 B2 | 3/2008 | Braune et al. |
| 7,348,600 B2 | 3/2008 | Narukawa et al. |
| D565,516 S | 4/2008 | Kamada |
| 7,351,356 B2 | 4/2008 | Delsing et al. |
| 7,352,011 B2 | 4/2008 | Smits et al. |
| 7,355,209 B2 | 4/2008 | Tsai et al. |
| 7,355,210 B2 | 4/2008 | Ou et al. |
| 7,355,284 B2 | 4/2008 | Negley |
| 7,358,522 B2 | 4/2008 | Yanamoto |
| 7,358,540 B2 | 4/2008 | Hsieh et al. |
| 7,361,938 B2 | 4/2008 | Mueller et al. |
| 7,362,048 B2 | 4/2008 | Shimizu et al. |
| 7,365,369 B2 | 4/2008 | Nakamura et al. |
| 7,365,371 B2 | 4/2008 | Andrews |
| 7,368,329 B2 | 5/2008 | Waitl et al. |
| 7,372,198 B2 | 5/2008 | Negley |
| 7,375,377 B2 | 5/2008 | Baur et al. |
| D571,738 S | 6/2008 | Wall, Jr. |
| 7,382,033 B2 | 6/2008 | Roth et al. |
| 7,384,809 B2 | 6/2008 | Donofrio |
| 7,385,226 B2 | 6/2008 | Ou et al. |
| 7,387,677 B2 | 6/2008 | Dwilinski et al. |
| 7,388,232 B2 | 6/2008 | Suehiro et al. |
| 7,390,684 B2 | 6/2008 | Izuno et al. |
| D572,209 S | 7/2008 | Tokuda |
| 7,393,122 B2 | 7/2008 | Tsuzuki et al. |
| 7,393,213 B2 | 7/2008 | Yoo et al. |
| 7,402,837 B2 | 7/2008 | Slater, Jr. et al. |
| 7,402,840 B2 | 7/2008 | Krames et al. |
| 7,405,093 B2 | 7/2008 | Andrews |
| 7,414,269 B2 | 8/2008 | Grotsch et al. |
| 7,419,839 B2 | 9/2008 | Camras et al. |
| 7,429,750 B2 | 9/2008 | Suehiro et al. |
| 7,429,758 B2 | 9/2008 | Ruhnau et al. |
| D578,226 S | 10/2008 | West et al. |
| 7,432,534 B2 | 10/2008 | Yoo et al. |
| 7,432,536 B2 | 10/2008 | Slater, Jr. et al. |
| 7,432,589 B2 | 10/2008 | Yamamoto et al. |
| 7,432,642 B2 | 10/2008 | Murazaki |
| 7,432,647 B2 | 10/2008 | Nagatomi et al. |
| 7,436,002 B2 | 10/2008 | Brunner et al. |
| 7,436,066 B2 | 10/2008 | Sonobe et al. |
| 7,439,091 B2 | 10/2008 | Chen et al. |
| 7,439,609 B2 | 10/2008 | Negley |
| 7,442,254 B2 | 10/2008 | Kiyoku et al. |
| 7,442,644 B2 | 10/2008 | Nogami |
| 7,442,966 B2 | 10/2008 | Bader et al. |
| D580,380 S | 11/2008 | Tokuda |
| 7,445,354 B2 | 11/2008 | Aoki et al. |
| 7,446,343 B2 | 11/2008 | Mueller et al. |
| 7,446,344 B2 | 11/2008 | Fehrer et al. |
| 7,446,345 B2 | 11/2008 | Emerson et al. |
| 7,446,346 B2 | 11/2008 | Harle |
| 7,452,737 B2 | 11/2008 | Basin et al. |
| 7,456,499 B2 | 11/2008 | Loh et al. |
| D582,865 S | 12/2008 | Edmond et al. |
| D582,866 S | 12/2008 | Edmond et al. |
| 7,462,861 B2 | 12/2008 | Slater, Jr. et al. |
| 7,473,933 B2 | 1/2009 | Yan |
| 7,772,604 B2 * | 8/2010 | Duong et al. .............. 257/95 |
| 7,789,531 B2 | 9/2010 | Duong et al. |
| 7,829,358 B2 | 11/2010 | Duong et al. |
| 2002/0012247 A1 | 1/2002 | Kamiya et al. |
| 2002/0017844 A1 | 2/2002 | Parkyn et al. |
| 2002/0080615 A1 | 6/2002 | Marshall et al. |
| 2002/0080622 A1 | 6/2002 | Pashley et al. |
| 2002/0123164 A1 | 9/2002 | Slater et al. |
| 2002/0127864 A1 | 9/2002 | Smith et al. |
| 2002/0141006 A1 | 10/2002 | Pocius et al. |
| 2002/0163808 A1 | 11/2002 | West et al. |
| 2003/0002272 A1 | 1/2003 | Suehiro et al. |
| 2003/0036217 A1 | 2/2003 | Richard |
| 2003/0089914 A1 | 5/2003 | Chen |
| 2003/0132447 A1 | 7/2003 | Yukimoto |
| 2003/0156416 A1 | 8/2003 | Stopa et al. |
| 2004/0016718 A1 | 1/2004 | Hwu et al. |
| 2004/0036080 A1 | 2/2004 | Bogner et al. |
| 2004/0046489 A1 | 3/2004 | Vetorino et al. |
| 2004/0079957 A1 | 4/2004 | Andrews et al. |
| 2004/0114393 A1 | 6/2004 | Galli |
| 2004/0120153 A1 | 6/2004 | Pate |
| 2004/0126913 A1 | 7/2004 | Loh |

| | | | |
|---|---|---|---|
| 2004/0155565 A1 | 8/2004 | Holder et al. |
| 2004/0201987 A1 | 10/2004 | Omata |
| 2004/0207774 A1 | 10/2004 | Gothard |
| 2004/0218390 A1 | 11/2004 | Holman et al. |
| 2004/0222426 A1 | 11/2004 | Hsiung |
| 2004/0232825 A1 | 11/2004 | Sorg |
| 2004/0233665 A1 | 11/2004 | West et al. |
| 2004/0264185 A1 | 12/2004 | Grotsch et al. |
| 2005/0001230 A1 | 1/2005 | Takekuma |
| 2005/0006651 A1 | 1/2005 | LeBoeuf et al. |
| 2005/0007777 A1 | 1/2005 | Klipstein et al. |
| 2005/0018248 A1 | 1/2005 | Silverbrook |
| 2005/0024887 A1 | 2/2005 | Boyler |
| 2005/0047729 A1 | 3/2005 | Vilgiate |
| 2005/0063181 A1 | 3/2005 | Chiba et al. |
| 2005/0073840 A1 | 4/2005 | Chou et al. |
| 2005/0073849 A1 | 4/2005 | Rhoads et al. |
| 2005/0077529 A1 | 4/2005 | Shen |
| 2005/0173719 A1 | 8/2005 | Yonekubo |
| 2005/0195488 A1 | 9/2005 | McCabe et al. |
| 2005/0215000 A1 | 9/2005 | Negley |
| 2006/0046622 A1 | 3/2006 | Prasad |
| 2006/0094340 A1 | 5/2006 | Ouderkirk et al. |
| 2006/0108590 A1 | 5/2006 | Kawaguchi |
| 2006/0192194 A1 | 8/2006 | Erchak et al. |
| 2007/0108459 A1 | 5/2007 | Lu |
| 2007/0152230 A1 | 7/2007 | Duong et al. |
| 2008/0030993 A1 | 2/2008 | Narendran et al. |
| 2008/0062672 A1 | 3/2008 | Peng et al. |
| 2008/0080166 A1 | 4/2008 | Duong et al. |
| 2008/0081531 A1 | 4/2008 | Duong et al. |
| 2008/0266893 A1 | 10/2008 | Speier |
| 2009/0085043 A1 | 4/2009 | Song et al. |
| 2009/0085052 A1 | 4/2009 | Ko et al. |
| 2009/0087937 A1 | 4/2009 | Kim |
| 2009/0087994 A1 | 4/2009 | Lee et al. |
| 2009/0275157 A1 | 11/2009 | Winberg et al. |
| 2009/0275266 A1 | 11/2009 | Winberg et al. |

FOREIGN PATENT DOCUMENTS

| | | |
|---|---|---|
| JP | 2003-53647 | 2/2003 |
| JP | P3900144 | 1/2007 |
| WO | WO2007061638 | 5/2007 |

OTHER PUBLICATIONS

International Search Report and Written Opinion, International Patent Application No. PCT/US07/21117 mailed Mar. 25, 2008, 10 pgs.
International Preliminary Examination Report, International Application No. PCT/US2007/000102, mailed Jul. 17, 2008, 6 pgs.
Light-Emitting Diode, Wikipedia, Nov. 17, 2008, pp. 1-15, at http://en.wikipedia.org/wiki/Light-emitting_diode.
Cree XLamp LED Reliability, Cree LED Light, Sep. 2007, pp. 1-9, Cree, Inc., Durham, NC 27703, at www.cree.com/xlamp.
Golden Dragon Engineering Kit, OSRAM Opto Semiconductors GmbH, Oct. 4, 2006, Regensburg, Germany, at www.osram-os.com, 6 pgs.
Power Light Source Luxeon Rebel, Technical Datasheet DS56, Philips, Jul. 2008, Philips Lumileds Lighting Company, US, at www.luxeon.com, 34 pgs.
Specification for NICHIA Chip Type White LED, Model NSSW108T, Cat. No. 070606, NICHIA Corporation, 13 pgs.
Haque, High-power LED Stud-bump Packaging, Advanced Packaging, Apr. 2006, 6 pgs., at http://ap.pennnet.com/Articles/Article_Display.cfm?Section+ARTCL&ARTICLE_ID=252779&VERSI.
Wong et al., Packaging of Power LEDS Using Thermosonic Bonding of Au-Au Interconnects, SMTA Int'l Conf., Sep. 24, 2006, pp. 1-2, SMTA, Edina, MN at www.smta.org.
Moreno, LED Intensity Distribution, International Optical Design Conf. 2006, Jun. 2006, Optical Society of America, ISBN: 1-55752-814-4, 3 pgs.
Moreno et al., Modeling the Radiation Pattern of LEDs, Optics Express, Feb. 4, 2008, vol. 16, No. 3, Optical Society of America #90469, 12 pgs.
Cho et al., Dry etching of GaN and related materials; Comparison of techniques, IEEE Journal of Selected Topics in Quantum Electronics, 1998, 4(3):557-563, 11 pgs.
Mishra, GaN Vacuum Microelectronic Electron Emitter with Integrated Extractor, Santa Barbara CA, Jan. 28, 2009 at my.ece.ucsb.edu/mishra/vacuummicroelec/finalrepnsf.pdf, 4 pgs.
He, GaN layers re-grown on etched GaN templates by plasma assisted molecular beam epitaxy, Mat. Res. Soc. Symp. vol. 798, 2004 Materials Research Society, Richmond, VA, 4 pgs.
Gallium Nitride Film Growth, downloaded Feb. 6, 2009 at www.onr.navy.mil/sci_tech/31/312/ncsr/materials/gan/filmgrowth.asp?css printer&.
The Asymmetric Reflector, Elliptipar, West Haven, CT, 2 pgs., downloaded from http://www.elliptipar.com/reflector.asp on Mar. 27, 2009.
Sports Lighting Solutions, Lighting Information, Abacus Lighting Limited, Nottinghamshire, England, 3 pgs., downloaded from http://www.abacuslighting.comisportslighting.asp?sport=sn03 on Mar. 27, 2009.
Samsung files patents ahead of LED spin-out, Apr. 2, 2009, downloaded Apr. 14, 2009 at http://compoundsemiconductor.net/cws/article/news/38551, 2 pgs.
International Search Report and Written Opinion, International Patent Application No. PCT/US2009/033429, dated Apr. 15, 2009, 9 pgs.
International Preliminary Report on Patentability, International Patent Application No. PCT/US2007/021117, dated Apr. 7, 2009, 8 pgs.
Office Action issued in U.S. Appl. No. 11/906,194, mailed Jul. 24, 2009, 6 pgs.
International Search Report and Written Opinion, International Patent Application No. PCT/US09/48788, mailed Aug. 14, 2009, 6 pgs.
International Search Report and Written Opinion, International Patent Application No. PCT/US09/48787, mailed Aug. 14, 2009, 7 pgs.
Office Action issued in U.S. Appl. No. 11/649,018, mailed Sep. 4, 2009, 18 pgs.
International Search Report and Written Opinion, PCT/US09/051962, mailed Sep. 15, 2009, 5 pgs.
Office Action issued in U.S. Appl. No. 11/906,219 mailed on May 13, 2010, 13 pgs.
Notice of Allowance for U.S. Appl. No. 11/906,219, mailed Oct. 12, 2010, 6 pgs.
International Search Report and Written Opinion for International Application No. PCT/US2010/046108, mailed Oct. 18, 2010, 7 pgs.
Office Action for U.S. Appl. No. 11/906,219 mailed Jan. 18, 2011, 11 pgs.
International Preliminary Report on Patentability for International Application No. PCT/US2009/048787 mailed Jan. 13, 2011, Patent Cooperation Treaty, 7 pgs.
International Preliminary Report on Patentability for International Application No. PCT/US2009/048788 mailed Jan. 13, 2011, Patent Cooperation Treaty, 6 pgs.
European Search Report and Written Opinion for Application No. EP 07716261, mailed Nov. 30, 2010, 8 pgs.

* cited by examiner

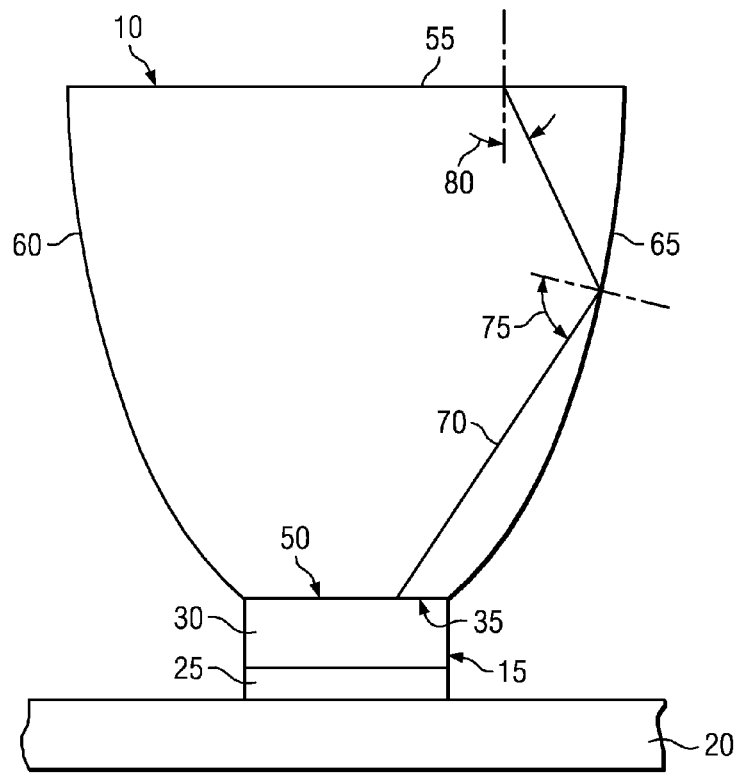
FIG. 1
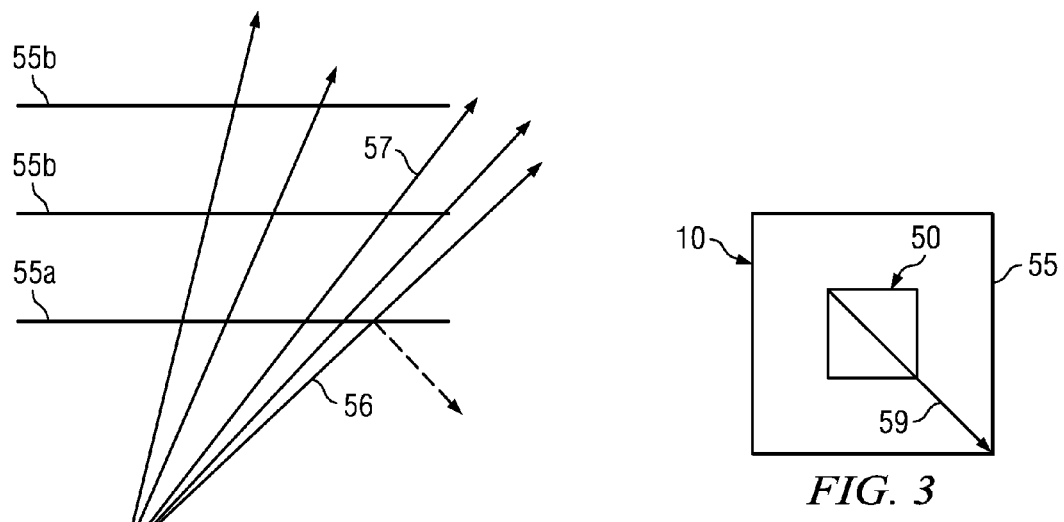
FIG. 2
FIG. 3

SEPARATE OPTICAL DEVICE FOR DIRECTING LIGHT FROM AN LED

RELATED APPLICATIONS

This application is a continuation of and claims the benefit of priority under 35 U.S.C. 120 to U.S. patent application Ser. No. 11/649,018, entitled "Separate Optical Device for Directing Light from an LED", filed Jan. 3, 2007 now U.S. Pat. No. 7,772,604, which claims the benefit of priority under 35 U.S.C. 119(e) to U.S. Provisional Application No. 60/756,845, entitled "Optical Device", to Duong et al., filed Jan. 5, 2006, each of which are hereby fully incorporated by reference herein.

TECHNICAL FIELD OF THE INVENTION

The present invention relates to separate optical devices. Even more particularly, embodiments of the present invention relate to devices and methods that increase the ability to harness light from a separate light emitting diode ("LED").

BACKGROUND

Light emitting diodes ("LED") are ubiquitous in electronics. They are used in digital displays, lighting systems, computers and televisions, cellular telephones and a variety of other devices. In an LED, as in a traditional diode, extra electrons move from an N-type semiconductor to electron holes in a P-type semiconductor. In an LED, however, photons are released to produce light during this process. For many applications it is desirable to collect as much light as possible from the LED and distribute it into a desired cone angle.

Many conventional LED devices use a dome spherical or aspheric lens formed around the LED. Generally, the distance from the lens to the dome controls the emission cone. The T-1¾, T-5 mm or variations thereof are examples of dome lens LEDs. However, there are several drawbacks to this design. First, typical domes can only collect an f/1 acceptance angle of the LED die. Hence, photons emitted greater than this angle are either trapped within the dome due to total internal reflection ("TIR") or emitted out the edge of the dome at a non-usable angle. Next, the distribution of the light is highly dependent on the accuracy of the alignment between the chip and the dome. Therefore, far field and near field distributions are often sacrificed. Third, there can be significant non-uniformities between the near-field and far field distribution. Lastly, the distribution itself is not spatially uniform.

Another conventional scheme is to place a larger dome on top of the LED. Though this method does allow most if not all of the energy to get out, there are several significant drawbacks for practical applications. First, the emission cone angle is typically greater than 180 degrees. Though light is no longer trapped, energy is emitted to an angle greater than the original angle of the LED. Mechanical housings and such can vignette, scatter and absorb the light at the larger angles. Moreover, since most secondary optical systems only collect an f/1 cone (a cone having a half angle of approximately 30 degrees or less), much of the light is lost. Thirdly, since the dome is much larger than the LED die, the distribution is over a much larger area than necessary. This translates into a lower power density (or irradiance) when the light is focused.

Another solution is to place a TIR lens over the typical dome lens to collect all of the emitted energy and direct it into a smaller cone. This adds complexity to the system and only addresses the problem of getting more light into a narrower cone angle. These systems also do not address conservation of brightness of the source, creating a uniform pattern and maintaining the uniformity far field as well as near field. Also, adding such a TIR lens increases the size and cost of a lighting package as much as tenfold, rendering this solution impractical for nearly all LED applications in electronics and portable devices. Other systems utilize elaborate TIR lens, reflective collectors and condenser lens systems. While some reflective systems that re-image the LED from a dome can maintain the radiance (e.g., an ellipsoid where the LED is at one foci and the image is at the other foci), these systems are impractical for many applications.

SUMMARY OF THE INVENTION

Embodiments of the present invention provide separate optical devices and methods that substantially eliminate or reduce the shortcomings of previous separate optical device systems and methods. For purposes of this disclosure a "separate optical device" is an optical device that is formed independently from the LED, but may be molded in place on top of the LED.

One embodiment of the present invention includes a separate optical device operable to couple to an LED; the separate optical device comprises an entrance surface to receive light from a layer of a separate light emitting diode when the separate optical device is coupled to the LED, and an exit surface opposite from and a distance from the entrance surface. The exit surface has at least a minimum area necessary to conserve brightness for a desired half-angle of light emitted from the separate optical device. Furthermore, the separate optical device can include a set of sidewalls. Each sidewall may be positioned and shaped so that at least a majority of rays having a straight transmission path from the entrance surface to that sidewall reflect to the exit surface with an angle of incidence at the exit surface at less than or equal to the critical angle at the exit surface.

Another embodiment of the present invention includes a separate optical device operable to couple to a separate LED, the separate optical device comprising an entrance surface to receive light from a layer of a separate non-circular LED when the separate optical device is coupled to the separate non-circular LED, an exit surface opposite from and a distance from the entrance surface, and a set of sidewalls. The exit surface, according to one embodiment, has at least a minimum area necessary to conserve brightness for a desired half-angle of light emitted from the separate optical device. Furthermore, each sidewall can be positioned and shaped so that at least a portion of rays having a straight transmission path from the entrance surface to that sidewall reflect to the exit surface with an angle of incidence at the exit surface at less than or equal to a critical angle at the exit surface. Each sidewall shape represents a superposition of multiple contoured surfaces. The area of the exit surface, distance and sidewall shapes can be selected to project light with a half angle of between 10 to 60 degrees with at least 60% efficiency and a desired intensity profile.

Another embodiment of the present invention includes a separate optical device configured to couple to a separate LED, the separate optical device comprising an entrance surface to receive light from a layer of a separate non-circular LED when the separate optical device is coupled to the separate non-circular LED, an exit surface opposite from and a distance from the entrance surface, and a set of sidewalls. The exit surface can have an area at least equal to a minimum area defined by $$\frac{n_1^2 A_1 \Omega_1}{n_2^2 \Omega_2},$$

wherein $\Omega_1$ is the effective solid angle whereby light enters the entrance surface, $\Omega_2$ is the effective solid angle whereby light leaves the exit surface, $A_1$ is the area of the entrance surface, $n_1$ is the refractive index of material of the separate optical device and $n_2$ is the refractive index of the substance external to the separate optical device. The distance between the entrance surface and exit surface can be selected to be at least a minimum distance so that all rays with a straight transmission path from the entrance surface to the exit surface have an angle of incidence that is less than or equal to a critical angle at the exit surface. Furthermore, each sidewall can be positioned and shaped so that at least a portion of rays having a straight transmission path from the entrance surface to that sidewall reflect to the exit surface with an angle of incidence at the exit surface at less than or equal to the critical angle at the exit surface. Each sidewall shape can represent a superposition of multiple contoured surfaces. The area of the exit surface, distance and sidewall shapes can be selected to project light with a half angle of between 10 to 60 degrees with at least 60% efficiency and a desired intensity profile.

Embodiments of the present invention provide a separate optical device that provides technical advantages over the prior art by projecting light with a desired half-angle and intensity profile, while conserving brightness. Embodiments of the present invention can provide, for example, light in 10 to 60 degrees half angle (or other half angles) with 60-96% efficiency. Efficiencies can be higher than this (approaching 100%) with appropriate anti-reflection coatings on the exit surface or lower than this.

Another advantage is that separate optical devices according to embodiments of the present invention can be much smaller (including greater than ten times smaller) than previous separate optical devices.

Yet another advantage is that tight arrays of separate optical devices can be formed without or with very minimal losses.

Embodiments of the present invention provide yet another advantage by providing for square or rectangular outputs with uniform or near uniform intensity distributions.

Embodiments of the present invention provide another advantage by reducing or eliminating the need for secondary optics to create light with the desired half-angle.

Embodiments of the present invention provide yet another advantage by providing separate optical devices that can project light with a desired aspect ratio without additional optics.

Yet another advantage provided by embodiments of the present invention is that light can be projected with a desired shape and intensity profile in both near and/or far field.

BRIEF DESCRIPTION OF THE FIGURES

A more complete understanding of the present invention and the advantages thereof may be acquired by referring to the following description, taken in conjunction with the accompanying drawings in which like reference numbers indicate like features and wherein:

FIG. 1 is a diagrammatic representation of one embodiment of an optical system including a separate optical device according to an embodiment of the present invention;

FIG. 2 is a diagrammatic representation of a set of rays traveling from a point to surfaces at different distances from the point;

FIG. 3 provides a diagrammatic representation of a top view of a separate optical device according to one embodiment of the present invention;

DETAILED DESCRIPTION

Figure 4A:
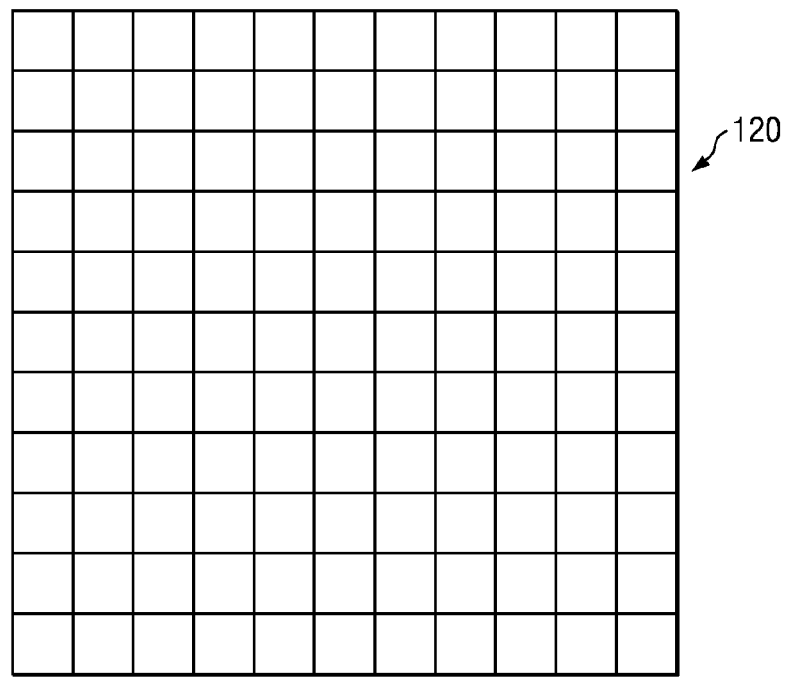
FIG. 4A is a diagrammatic representation of a cross-section of a model of a separate optical device for determining sidewall shapes.
Figure 4A:
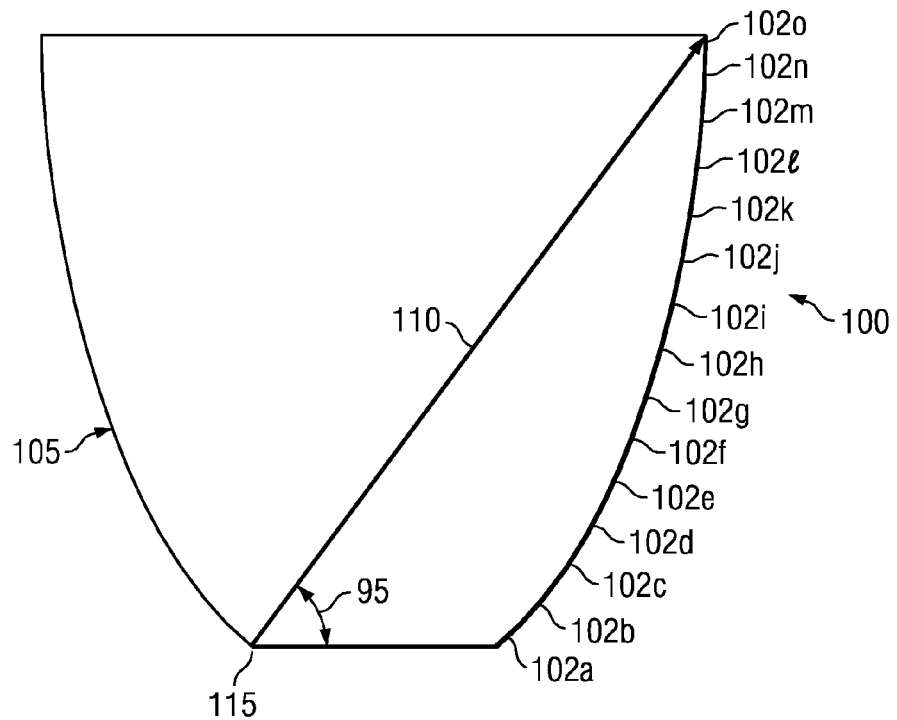

Preferred embodiments of the invention are illustrated in the FIGURES, like numerals being used to refer to like and corresponding parts of the various drawings.

Embodiments of the present invention provide a separate optical device that is coupled to an LED to direct light from the LED to an exit interface of the separate optical device. Ideally, the separate optical device is configured so that all the light entering the separate optical device from the LED is transmitted out the exit interface. To this end, the exit interface can be sized to take into account principles of conservation of radiance. The exit interface may be the minimum size that allows all light entering the separate optical device from the LED to exit the exit interface, thereby combining the desire to conserve radiance with the desire to reduce size. Additionally, the sidewalls of the device may be shaped so that reflection or total internal reflection ("TIR") causes light beams incident on the sidewalls to reflect towards the exit interface and be incident on the exit interface with an angle less than or equal to the critical angle. Consequently, light loss due to TIR at the exit interface is reduced or eliminated. For devices constructed of solid dielectric materials, use of TIR provides the advantage of lossless reflections. If the device is instead air-filled, then the sidewalls could be made of a reflective material which would introduce some minor losses.

While ideally 100% of the light entering the separate optical device exits the exit interface, various embodiments of the present invention may cause lesser amounts of light to exit the exit interface while still providing significant improvements over prior LED separate optical devices. More specifically, embodiments of the present invention allow light received from an LED to emitted from the exit surface with a cone half angle of 10-60 degrees with approximately 50-96% efficiency (there is approximately a 4% efficiency loss due to fresnel losses for a dielectric material of 1.5 index of refraction) with a desired intensity profile.

FIG. 1 is a diagrammatic representation of one embodiment of an optical system including a separate optical device 10, an LED 15 and a supporting structure 20. LED 15 includes a light emitting portion 25, typically a compound semiconductor such as InGaN or InGaP, and a substrate 30, such as sapphire substrate, silicon carbide (SiC) substrate or other substrate known or developed in the art. In FIG. 1, the substrate 30 is positioned as typically embodied, above the light emitting portion 25; in another typical design, the substrate 30 may be positioned below the light emitting portion 25. Light from LED 15 is primarily transmitted through emitting surface 35 to separate optical device 10. LED 15 can be a wire bond, flip chip or other LED known or developed in the art. FIG. 1 depicts the separate optical device affixed to the exit face of LED 15. Alternatively, it may be affixed to the substrate 20 and fully surround the LED 15.

The thickness of LED 15 is shown much greater in comparison to separate optical device 10 than in an actual device, for clarity.

Separate optical device 10 is formed separately from LED 15 and can be coupled to LED 15 or substrate 20 using a friction fit, optical cement or other coupling mechanism, whether mechanical, chemical, or otherwise. Preferably, separate optical device 10 is formed of a single, molded piece of dielectric, optically transmitting material with a single Index of Refraction ("IOR") "n", such as optically transparent silicone or acrylic, though other materials can be used. Furthermore, the IOR of separate optical device 10 is preferably within 20% of the IOR of substrate 30 (and ideally, IOR of separate optical device 10 is equal to or greater than IOR of substrate 30).

Separate optical device 10 includes an entrance surface 50 to receive light transmitted from LED 15. Entrance surface 50, according to one embodiment, is the same shape as LED 15 and has an edge dimension approximately the same size as or slightly larger than the edge dimension of emitting surface 35 of LED 15. That is, the area of entrance surface 50 is approximately the same size as the area of LED 15 that transmits light to separate optical device 10, though entrance surface 50 may be slightly larger than LED 15 to account for tolerances in the manufacturing process, errors in alignment of separate optical device 10 and LED 15, or other factors. As an example, for a 1 mm square LED, entrance surface 50 may be manufactured to be 1.075 mm on each side.

Separate optical device 10 further includes exit surface 55 that preferably is substantially the same shape as, substantially parallel to and substantially rotationally aligned with entrance surface 50 within the tolerance of the manufacturing process. The area of exit surface 55 can be chosen to conserve brightness for a desired half angle according to the conservation of radiance (sometimes called the conservation of brightness) equation:

$$\frac{\Phi_2 n_1^2 A_1 \Omega_1}{\Phi_1 n_2^2 \Omega_2} = A_2 \quad \text{[EQN. 1]}$$

$\Phi_1$=light flux entering entrance surface 50;
$\Phi_2$=light flux exiting exit surface 55, $\Phi_1$=$\Phi_2$ for conservation of brightness;
$\Omega_1$=effective solid angle whereby light enters entrance surface 50;
$\Omega_2$=effective solid angle whereby light leaves exit surface 55;
$A_1$=area of entrance surface 50;
$A_2$=area of exit surface 55;
$n_1$=refractive index of material of separate optical device;
$n_2$=refractive index of substance external to the exit of separate optical device 10 (e.g., typically air or other substance).

$A_2$ represents the minimum surface area of exit surface 55 so that brightness is conserved per the above equation. Assume, for example: LED 15 is a 1 mm square LED so that entrance surface 50 is approximately 1 mm square, $n_1$=1.5, $n_2$=1, $\Omega_1$=3, $\Omega_2$=1, then $A_2$ must be at least 6.75 mm² to conserve radiance. While in this example the effective solid angles are given, methods for determining $\Omega_1$ and $\Omega_2$ for a desired half angle are discussed below in conjunction with FIGS. 6A-6E.

$A_2$ according to EQN. 1 is the minimum possible size for a given output cone angle or Emission Half Angle to conserve radiance. Consequently, to conserve radiance, $A_2$ should be at least the size determined from EQN 1, but may be larger. For example, $A_2$ may be made slightly larger to compensate for tolerances in the manufacturing process, errors in aligning separate optical device 10 with LED 15 or other factors.

In the case where $A_2$ is made larger than the value determined by equation 1, flux will be conserved, but exitance (defined as flux per unit area) will be reduced from the maximum attainable value.

To save space, however, it is preferable that $A_2$ be as small as possible. For example, $A_2$ is preferably within 5% of the minimum area needed to conserve radiance within 5%. If some light power (luminous flux) may be sacrificed, $A_2$ can be smaller than the size dictated by conservation of radiance. Furthermore, the shape of exit surface 55 may be different than that of entrance surface 50, so long as the area meets the requirements discussed above.

The distance between entrance surface 50 and exit surface 55 of separate optical device 10—referred to as the "height" herein, though the distance may extend in other directions than the vertical—may be selected to reduce or minimize TIR of light rays traveling directly from entrance surface 50 to exit surface 55. TIR occurs when light is incident on the surface with an angle of incidence greater that critical angle, which is defined by:

$$n_i * \sin(\theta_c) = n_2 \sin(90) \quad \text{EQN. 2}$$

where $n_1$=IOR of separate optical device;
$n_2$=IOR of substance external to the exit of separate optical device 10 (e.g., air or other substance); and
$\theta_c$=the critical angle.

For example, if $n_1$=1.5 and $n_2$=1, then $\theta_c$=41.81 degrees. Accordingly, the height of separate optical device 10 can be selected to limit the critical angle of rays incident on exit surface 55 to a range between normal to exit surface 55 and less than or equal to the critical angle.

Referring briefly to FIGS. 2 and 3, FIG. 2 is a diagrammatic representation of a set of rays traveling from point 57 incident on a surface 55 (represented as surfaces 55a, 55b and 55c at different distances from point 57). In the example of surface 55a, some rays (e.g., ray 56) are incident on surface 55a at greater than the critical angle, causing loss of light due to TIR. In the example of surface 55b, conversely, some rays that would be incident on surface 55c at the critical angle or somewhat less than the critical angle (e.g., ray 57) will instead be incident on the sidewalls. Preventing loss of these rays, if desired, can cause the complexity of the sidewall design to increase. Moreover, the additional height requires more room to accommodate the optical device (i.e., because the optical device is taller). Finally, in the case of surface 55c, rays at or less than the critical angle are incident on surface 55 while rays that would be greater than the critical angle on exit surface 55 instead are incident on the sidewalls. TIR or reflection can be used to direct the rays incident on the sidewalls to exit surface 55 as discussed below.

The limiting ray for selecting height, according to one embodiment, is the ray that travels the longest straight line distance from entrance surface 50 to exit surface 55 and is incident on exit surface 55 at the critical angle. There may be more than one ray that can be selected as the limiting ray. In a square or rectangular configuration this is the ray that enters separate optical device 10 at a corner of entrance surface 50 and travels in a straight line to the diagonally opposite corner of exit surface 55 such that the ray would be incident on exit surface 55 at the critical angle.

FIG. 3 provides a diagrammatic representation of a top view of a separate optical device 10 and of limiting ray 59 for a square configuration. While, in the preferred embodiment, the height of separate optical device 10 is selected to limit the critical angle of rays incident on exit surface 55 to a range of between normal to exit surface 55 and to less than or equal to the critical angle, other heights can be selected, though the use of other heights may decrease the efficiency of separate optical device 10. Preferably, the distance between the entrance surface and exit surface is within 5% of the minimum height that causes all rays with a straight transmission path from the entrance surface to the exit surface to have an angle of incidence on the exit surface at less than or equal to the critical angle.

Returning to FIG. 1, with selected boundary conditions of the size and shape of entrance surface 50, size and shape of exit surface 55, size and distance between entrance surface 50 and exit surface 55, the sidewalls (e.g., sidewall 60, sidewall 65 and other sidewalls) of separate optical device 10 can be shaped to direct light incident on the inner side of the sidewalls to exit surface 55 to produce a desired intensity profile. While, for most applications the desired intensity profile is uniform or close to uniform, other distribution profiles can be achieved by varying the height and shapes of the sidewalls. It should be noted that for the case of an ideal emitter having a uniform lambertian emission pattern, and for an optical device having the minimum calculated surface area per EQUATION 1, and a uniform radiant intensity distribution at the exit face, then the etendue equation REQUIRES the distribution of the exitance at the exit face to also be uniform. If an exitance profile other than a uniform one is desired, then the output face area must be larger than that calculated with EQN. 1. In no case is it possible for any elemental area of the output face to have a radiance greater than the radiance of the source.

Broadly speaking, the sidewall shapes are determined so that any ray incident on a sidewall is reflected to exit surface 55 and is incident on exit surface 55 at the critical angle or less (i.e., so that there is no loss due to internal reflection at exit surface 55). This is shown in FIG. 1 by ray 70 that has angle of incidence 75 relative sidewall 65 that is greater than $\theta_c$ so that ray 70 is reflected to exit surface 55 and has an angle of incidence 80 that is less than or equal to $\theta_c$. While, preferably, the sidewalls are shaped so that all rays that encounter the inner surface of the sidewalls experience total internal reflection to exit surface 55 and are incident on exit surface 55 at the critical angle or less, other sidewall shapes that allow some loss can be used.

FIG. 4A is a diagrammatic representation of a cross-section of a model of a separate optical device for determining sidewall shapes. Sidewall shapes can be determined using computer-aided design. A model of the sidewall can be created in a computer-aided design package and simulations run to determine an appropriate sidewall shape.

According to one embodiment, each sidewall can be divided into n facets with each facet being a planar section. For example, sidewall 100 is made of fifteen planar facets 102a-102o rather than a continuous curve. The variables of each facet can be iteratively adjusted and the resulting distribution profiles analyzed until a satisfactory profile is achieved as described below. While the example of fifteen facets is used, each sidewall can be divided into any number of facets, including more than thirty facets.

Each facet can be analyzed with respect to reflecting a certain subset of rays in a separate optical device. This area of interest can be defined as an "angular subtense." The angular subtense for a facet may be defined in terms of the angles of rays emanating from a predefined point. Preferably, the point selected is one that will give rays with the highest angles of incidence on the facet because such rays are the least likely to experience TIR at the facet. In a square separate optical device, for example, this will be a point on the opposite edge of the entrance surface.

According to one embodiment, for a selected $A_1$, $A_2$, and height, the maximum of angle 95 of any ray that will be incident on a given sidewall (e.g., sidewall 100) without being previously reflected by another sidewall can be determined. In this example, ray 110 emanating from point 115 establishes the maximum angle 95 for sidewall 100. If the maximum of angle 95 is 48 degrees and there are 15 facets for sidewall 100, each facet (assuming an even distribution of angular subtenses) will correspond to a 3.2 degree band of angle 95 (e.g., a first facet will be the area on which rays emanating from point 115 with an angle 95 of 0-3.2 degrees are incident, the second facet will be the area on which rays emanating at point 115 with an angle 95 of 3.2-6.4 degrees are incident and so on).

For each facet the exit angle, facet size, tilt angle, or other parameter of the facet can be set so that all rays incident on the facet experience TIR and are reflected to exit surface 55 such that they are incident on exit surface 55 with an angle of incidence of less than or equal to the critical angle. Preferably, the sidewalls are also shaped so that that a ray viewed in a cross-sectional view only hits a side wall once. However, there may be third dimension reflection from a sidewall out of plane of the section. For a full 3D analysis, a ray that strikes a first sidewall near a corner, may then bounce over to a second side wall, adjacent to the first, and from there to the exit face. A curve fit or other numerical analysis may be performed to create a curved sidewall shape that best fits the desired facets. In FIG. 4A, for example, sidewall 105 is curved rather than a set of planar facets.

To optimize the variables for each facet, a simulated detector plane 120 can be established. Detector plane 120 can include x number of detectors to independently record incident power. A simulation of light passing through the separate optical device may be performed and the intensity distribution as received by detector plane 120 analyzed. If the intensity distribution is not satisfactory for a particular application, the angles and angular subtenses of the facets can be adjusted, a new curved surface generated and the simulation re-performed until a satisfactory intensity profile is reached. Additional detector planes can be analyzed to ensure that both near field and far field patterns are uniform. Alternatively, the simulation(s) can be performed using the facets rather than curved surfaces and the surface curves determined after a desired intensity profile is reached. In yet another embodiment, the sidewalls can remain faceted and no curve be generated.

Figure 4B:
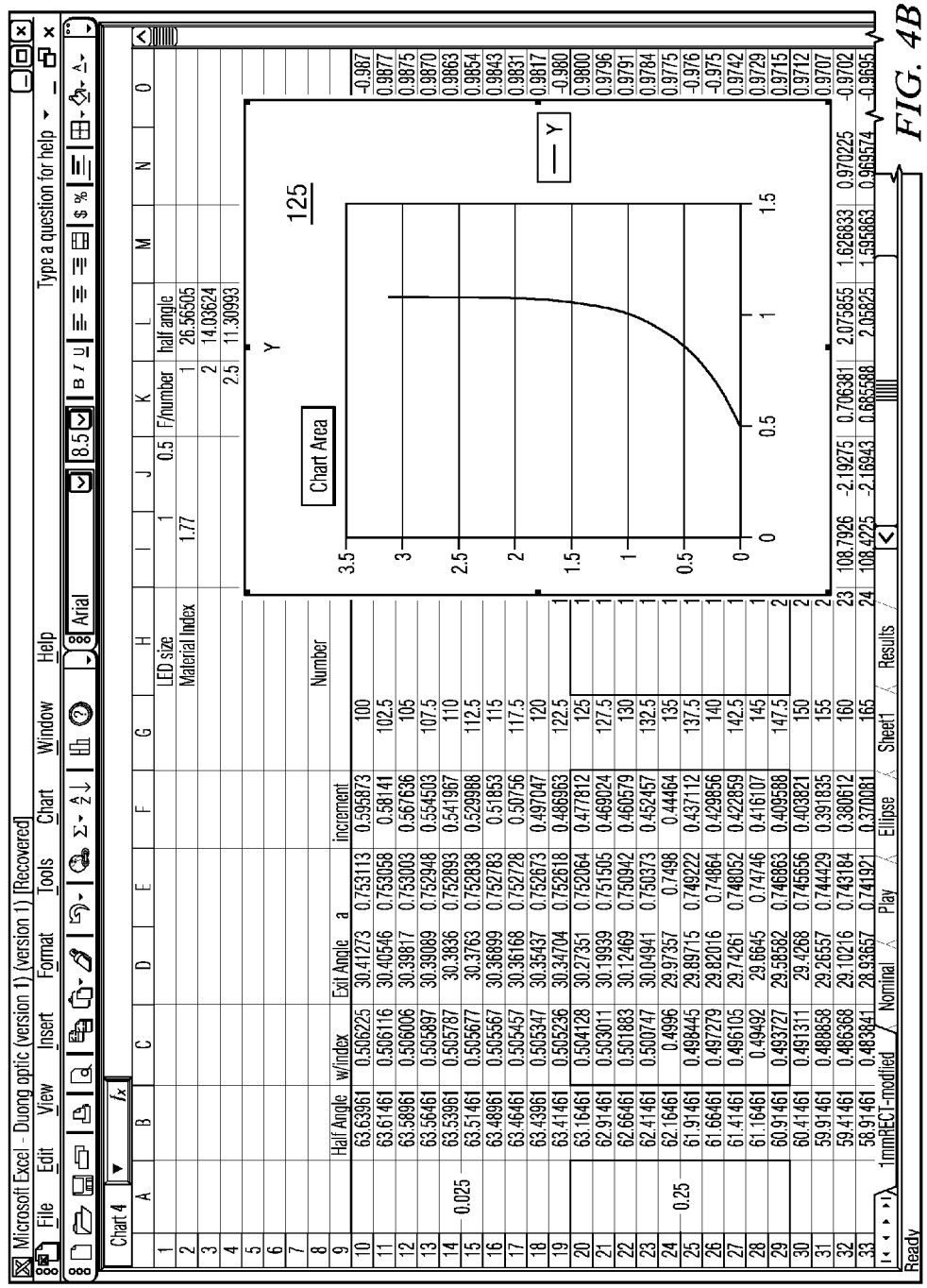
FIG. 4B is a diagrammatic representation illustrating that the facets for a sidewall can be defined using a computer program.

FIG. 4B is a diagrammatic representation illustrating that the facets for a sidewall can be defined using a computer program such as Microsoft Excel (Microsoft and Excel are trademarks of Redmond, Wash.-based Microsoft Corporation). The graphing feature in Microsoft Excel can be used to create a graph, shown at 125, of a sidewall shape. The same general shape can be used for each sidewall or different shapes for different sidewalls. A separate optical device with the specified sidewall shape (or with a curved sidewall shape based on the specified facets) can be analyzed in, for example, Zemax optical design program (Zemax is a trademark of Zemax Development Corporation of Bellevue, Wash.). A computer simulation can be conducted in Zemax to generate a ray trace and an intensity and irradiance distribution profile. If the resulting intensity and irradiance profile has an unsatisfactory distribution or the efficiency of the separate optical device is too low, the variables of the various facets can be adjusted and the simulations performed again. This process can be automated through the use of a computer program to automatically adjust facet variables.

Figure 4C:
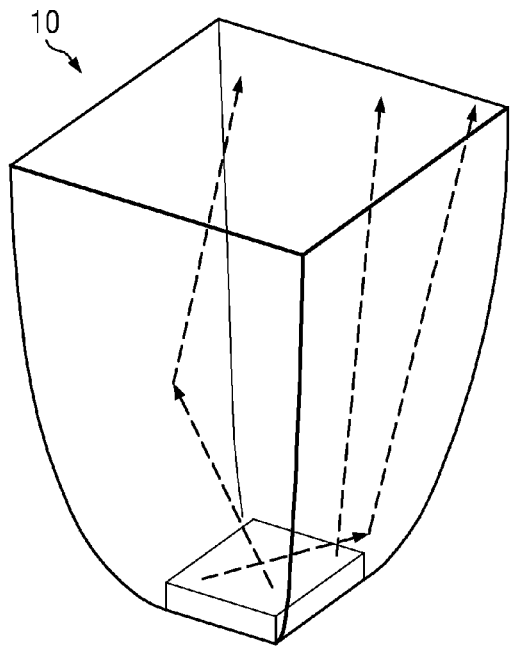
FIG. 4C is a diagrammatic representation of one embodiment of a separate optical device with sidewalls shaped to cause TIR so that rays are reflected from the sidewalls to the exit surface.

When a satisfactory efficiency and intensity profile are achieved, a separate optical device can be formed having the specified parameters. An example of such a separate optical device is shown in FIG. 4C which provides a diagrammatic representation of one embodiment of separate optical device 10 with sidewalls shaped to cause TIR so that rays are reflected from the sidewalls to the exit surface. The shape of each sidewall, in this embodiment, is a superposition of multiple contoured surfaces as defined by the various facets. While a curve fit is performed for ease of manufacturability, other embodiments of the present invention can retain faceted sidewalls.

As described above, various boundary conditions, particularly the area of exit surface 55, are determined for the separate optical device so that brightness is conserved. The minimum area of exit surface 55 can be determined from EQN. 1 above, which relies on various effective solid angles. Typically, the effective solid angle of light is determined based on equations derived from sources that radiate as Lambertian emitters, but that are treated as points because the distances of interest are much greater than the size of the source. The observed Radiant Intensity (flux/steradian) of a Lambertian source varies with the angle to the normal of the source by the cosine of that angle. This occurs because although the radiance (flux/steradian/m$^2$) remains the same in all directions, the effective area of the source decreases to zero as the observed angle increases to 90 degrees. Integration of this effect over a full hemisphere results in a projected solid angle value equal to $\pi$ steradians.

Figure 5:
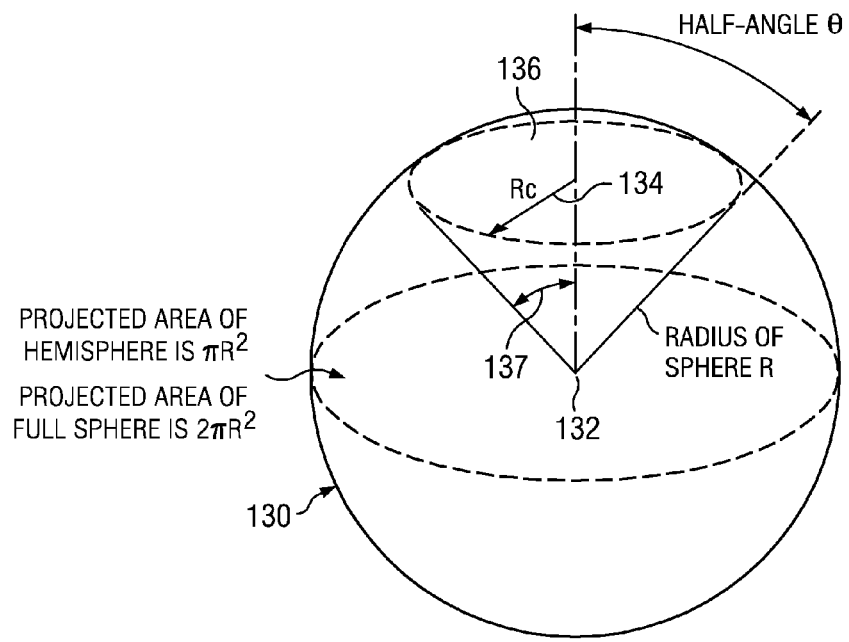
FIG. 5 is a diagrammatic representation of one embodiment for estimating effective solid angle.

Turning to FIG. 5, assume a sphere 130 of given radius (R) surrounds the point source 132. The area $A_3$ can be calculated as the flat, circular surface (e.g., surface 136) that is subtended by the beam solid angle of interest using a radius of the circle 134 ($R_c$) that is the distance from the normal ray to the intersection of the spherical surface. For a given half angle 137 of $\theta$ of the beam, $R_c$ is the product of R (the radius of the sphere) and the sine of the angle $\theta$, such that $$R_c = R * \mathrm{Sin}(\theta) \quad [\text{EQN. 3}]$$

The area equals:

$$A_3 = \pi R_c^2 = \pi (R * \mathrm{Sin}(\theta))^2 \quad [\text{EQN. 4A}]$$

The area $A_3$ is the projected area of the solid angle as it intersects the sphere. The area $A_3$ is divided by the projected area of the hemisphere ($A_h = \pi R^2$) and the quotient is multiplied by the projected solid angle of the full hemisphere (equal to $\pi$) to obtain the projected solid angle $\Omega$, such that:

$$\Omega = \pi * \frac{\{\text{projected area of desired solid angle}\}}{(\text{projected area of hemisphere})} \quad [\text{EQN. 4B}]$$

$$\Omega = (\pi) * [\{\pi(R * \mathrm{Sin}(\theta))^2\}/(\pi R^2)] \quad [\text{EQN. 4C}]$$

$$= \pi * \mathrm{Sin}^2(\theta) \quad [\text{EQN. 5}]$$

For entrance surface 50, $\theta$ is approximately 90 degrees, leading to a projected solid angle of $\pi * \mathrm{Sin}^2(90) = \pi$, and for the desired half angle of 30 degrees, the projected solid angle is $\pi * \mathrm{Sin}^2(30) = \pi/2$. Using these values for $\Omega_1$ and $\Omega_2$ for EQN. 1, $A_2$ can be determined for the desired half angle of 30 degrees.

In the above example, the effective solid angle is determined using equations derived from a point source. These equations do not consider the fact that LED 15 may be square, rectangular or otherwise shaped. While this method can give a good estimate of $A_2$, which can be later adjusted if necessary based on empirical or computer simulation testing, other methods of determining effective solid angle can be used.

Figure 6A:
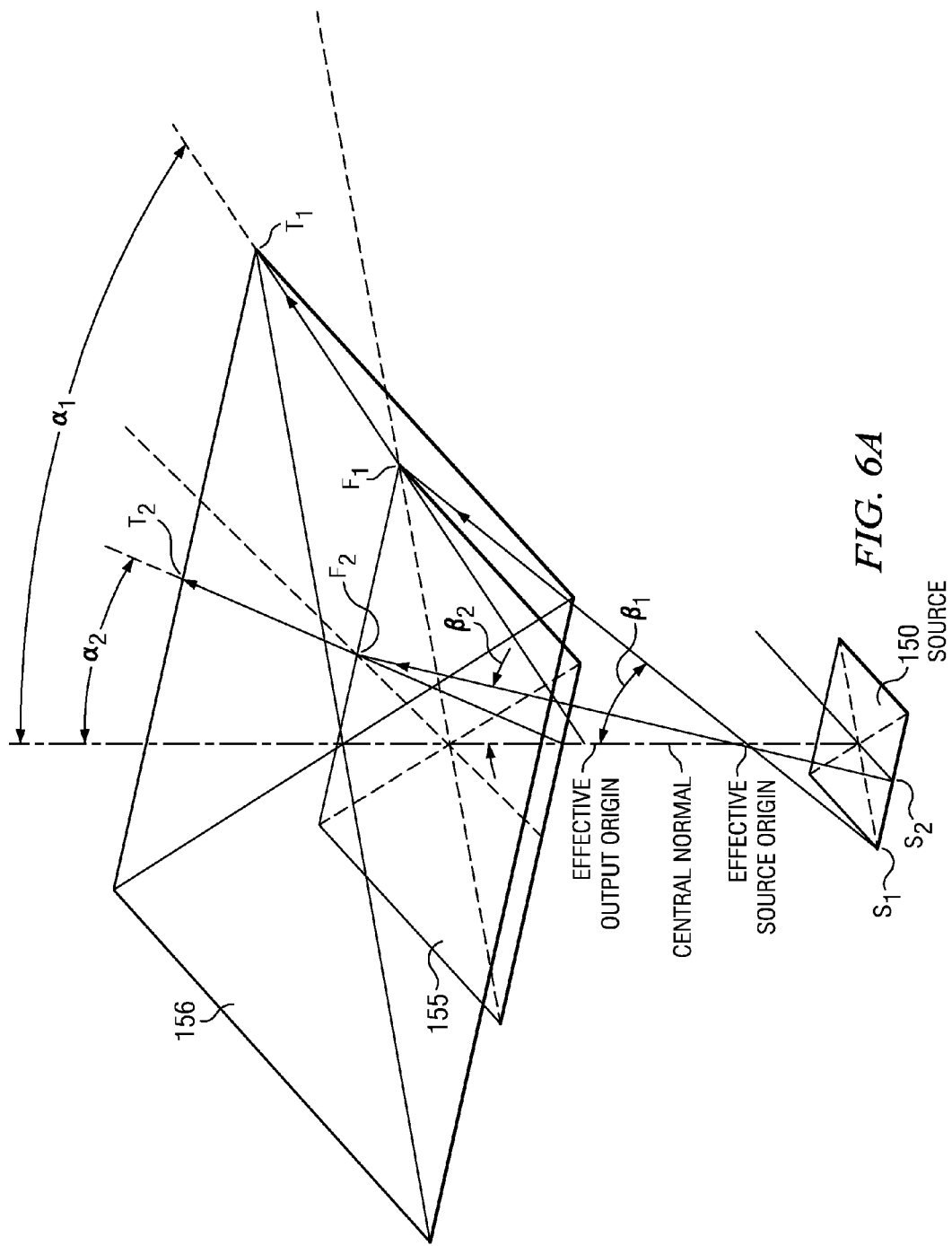
FIGS. 6A-6E are diagrammatic representations describing another embodiment for estimating effective solid angle.

FIGS. 6A-6E describe another method for determining effective solid angle for a separate optical device that attaches to an LED that more accurately accounts for the square profile of the typical separate LED. FIG. 6A is a diagrammatic representation of one embodiment of an entrance face 150 and an exit face 155 of a separate optical device 160 (shown in FIG. 6B) and a hypothetical target plane 156 onto which light is projected. For purposes of further discussion, it is assumed that the center of entrance face 150 is at 0,0,0 in a Cartesian coordinate system. Target plane 156 represents the parameters of the resulting pattern (e.g., size and half angle used by other optics). According to one embodiment, the half angle at the diagonal (shown as $\alpha_1$ in FIG. 6B) is the starting point. For example, if the desired light at target plane 156 has a maximum half angle of 30 degrees, $\alpha_1$ for a square- or rectangular-faced separate optical device is 30 degrees. The half-angle within separate optical device 160 (labeled $\beta_1$ and also shown in FIG. 6C) can then be determined according to:

$$n_2 \mathrm{Sin}(\alpha_1) = n_1 \mathrm{Sin}(\beta_1) \quad [\text{EQN. 6}]$$

where $n_1$ is the IOR of the separate optical device;
$n_2$ is the IOR of the material (typically air) into which the light is projected from the separate optical device; $\theta_1$ is the half angle in the LED material (typically 90 degrees);
$\beta_1$ is the desired half angle in the separate optical device.

Figure 6B:
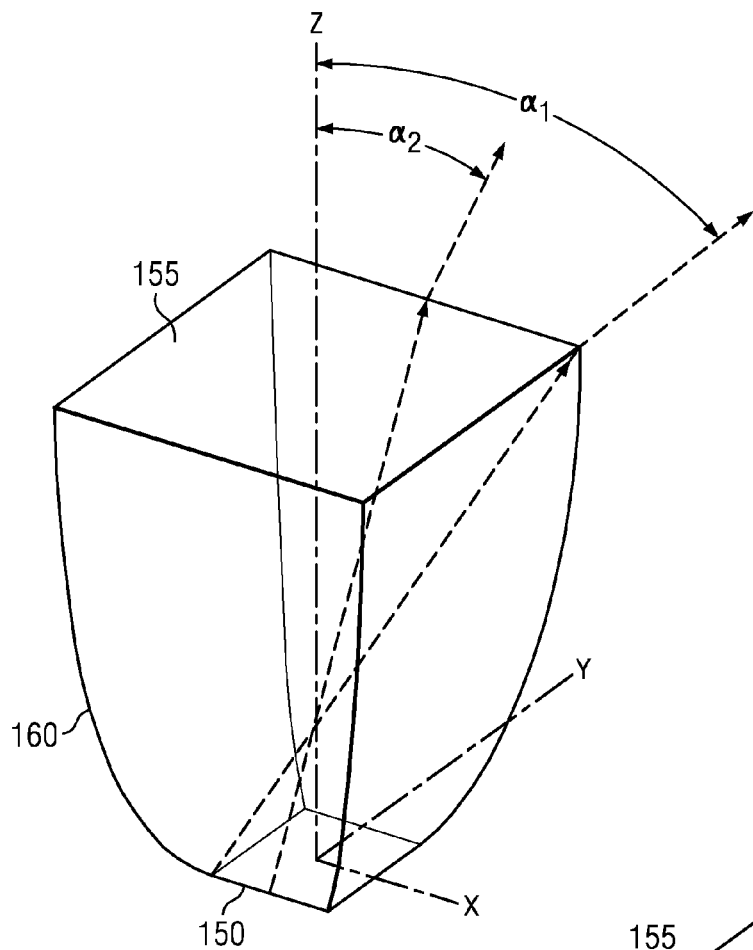
Figure 6C:
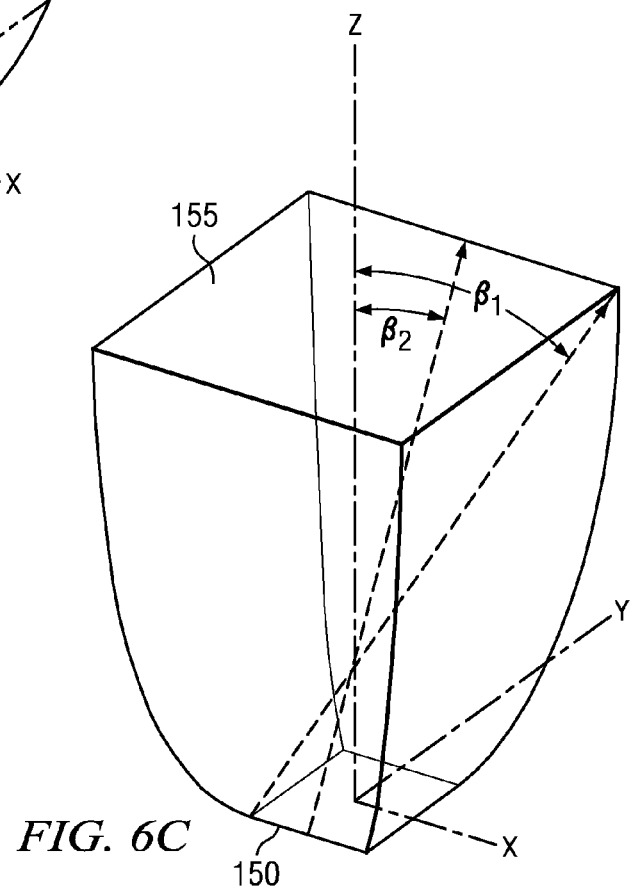

For example, if the desired half-angle $\alpha_1$ is 30 degrees, and a separate optical device having an IOR of 1.5 is projecting into air having an IOR of 1, then $\beta_1 = 19.47$ degrees. A similar calculation can be performed for a ray projecting from a point on the long and short sides of entrance surface 150. For example, as shown in FIGS. 6B and 6C, $\alpha_2$ and $\beta_2$ can be determined for a ray traveling from the center of one edge on entrance surface 150 to the center of the opposite edge of exit surface 155. (The critical angle is the same at 19.47, but $\beta_1$ is not the same as $\beta_2$. $\beta_2$ is determined by the geometry of the sides and the height to the optical device.)

Using the angles calculated, the location of an effective point source 157 can be determined. For a square entrance face 150, of length $l_1$, the effective point source will be located X=0, Y=0 and $$Z_{eps} = \frac{l_1}{\sqrt{2} * \tan(\beta_1)} \quad [\text{EQN. 7}]$$

Where $Z_{eps}$ is the distance the effective point source is displaced from the emitting surface of the LED.

The X, Y and Z distances from the effective point source 157 to points $F_1$ and $F_2$ can be calculated assuming $F_1$ intersects a sphere of unity radius according to:

$$X_{F1} = \cos(\psi_1)\sin(\beta_1) \quad \text{[EQN. 8]}$$

$$Y_{F1} = \sin(\psi_1)\sin(\beta_1) \quad \text{[EQN. 9]}$$

$$Z_{F1} = \cos(\beta_1) \quad \text{[EQN. 10]}$$

$$X_{F2} = \cos(\psi_2) \quad \text{[EQN. 11]}$$

$$Y_{F2} = \sin(\beta_2) \quad \text{[EQN. 12]}$$

$$Z_{F2} = \cos(\beta_2) \quad \text{[EQN. 13]}$$

where $\psi_1$ is the angle of the diagonal ray in the X-Y plane (45 degrees for a square) and where $\psi_2$=90 degrees for a ray projecting from the middle of a side parallel to the X axis as shown in FIG. 6C. A similar methodology based on the geometries previously calculated can be used to determine other points (e.g., for example, the location of points $T_1$ and $T_2$ can be determined based on the location of points $F_1$ and $F_2$ and the desired half angle of light at target plane 156.)

Figure 6D:
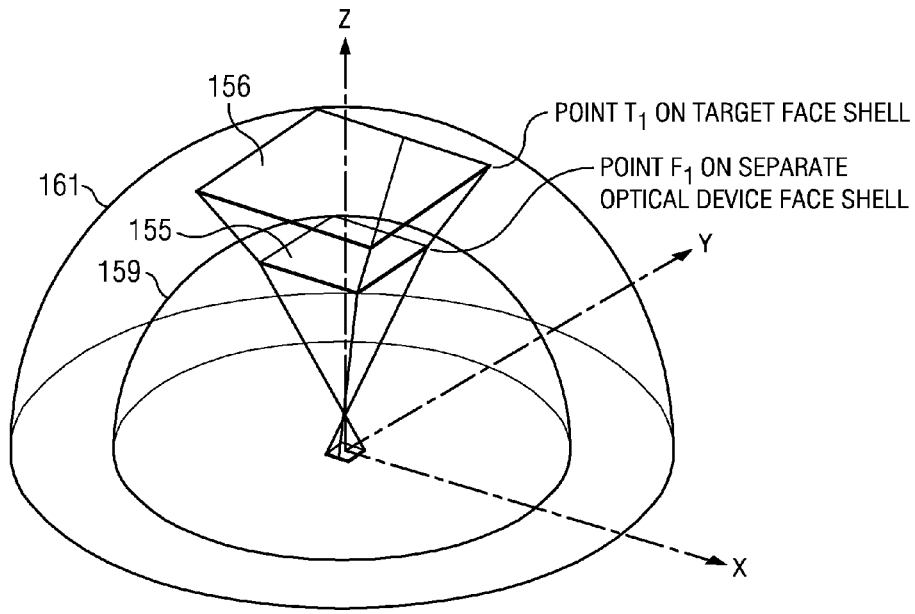
Figure 6E:
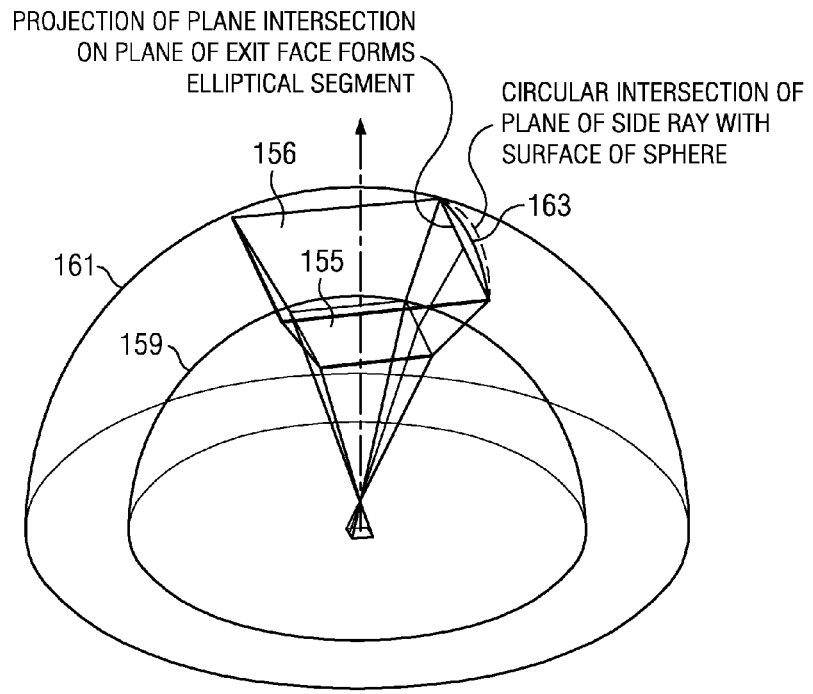

FIG. 6D illustrates the diagonal rays and one ray from the short side projected onto a sphere 159 for exit face 155 and sphere 161 for target plane 156. For exit face 155, the projection of the intersection of the edge rays at the sphere 159 onto the plane of the exit face 155, forms elliptical segments. Likewise, the projection of the diffracted exit rays at the edge of the target face intersect the sphere 161. FIG. 6E, for example, points out the circular intersection of the rays lying in the plane formed by the edge 163 of target face 156 intersecting sphere 161, and the projection of that intersection onto the target plane 156. By calculating the area of each of the elliptical segments surrounding the square of the target face, and adding that to the area of the target face we find the total projected area of the target face. the effective solid angle can be determined for the target plane using Eqn 4B Similarly, by using sphere 159 and the elliptical segments formed thereon by rays, the effective solid angle for the optical device can be determined. For example, the total projected area is determined as described above and inserted as "projected area of desired solid angle" in equation 4B.

As one illustrative example, using the above method for a half-angle of 30 degrees with a square LED and output face yields an effective solid angle of 0.552 steradians to the target in air. By contrast, the use of the traditional circular projected area with a 30 degree half angle would yield an effective solid angle of 0.785 steradians. When these values are then used in EQUATION 1, for given IORs and flux, the traditional (circular) calculation yields a required exit area that is undersized by about 30%. If one were to design a system using this approach, the applicable physics (conservation of radiance) would reduce the light output by 30% over the optimum design. Conversely, using the corrected effective solid angle described above calculates an exit face area that will produce 42% more light output than is achievable with the circular calculation.

Although particular methods of determining the effective solid angle for a separate optical device are described above, any method known or developed in the art can be used. Alternatively, the minimum surface area to conserve brightness can be determined empirically. Moreover, while the minimum surface area calculations above assume 100% of the emitting surface of the LED is emitting, in real life devices, less than 100% of the emitting surface area may be emitting and the distribution may be uneven. The calculations of the minimum area of the exit surface can be adjusted to account of the actual emitting area of the LED, rather the size of the entrance surface. That is, the actual emitting area of the LED can be used as $A_1$.

Separate optical devices according to embodiments of the present invention can project light into a desired cone angle of 10-60 degrees with a theoretical efficiency of up to 96% (meaning that 96% of the light received from the LED is emitted in the desired half-angles with 4% fresnel loss). The efficiency can be 100% without fresnel losses. Even at only 70% efficiency, embodiments of the present invention provide greater efficiency than other LED technologies, while also producing uniform or near uniform intensity distributions at both near and far fields.

Advantages of the present invention can easily be seen when compared to previous LED solutions. For a straight encapsulation (e.g., a square or cube encapsulation with straight vertical sidewalls), the effective solid angle at the entrance and exit are the same. Assuming an index of refraction of 1.5 for the separate optical device material and 1 for air, approximately 66% of light does not leave the surface opposite the entrance surface due to TIR. Consequently, a straight walled separate optical device only provides about 44% efficiency in the amount of light emitted out the surface opposite the entrance surface. Furthermore, secondary optics are needed to shape the light into the desired half angle.

While a dome optical device used on typical LEDs exhibits higher efficiency, there is still light loss due to TIR, and the emitted light is distributed over the dome surface in ray patterns that are not readily usable for most applications. Secondary collection mechanisms such as lenses or reflectors are therefore required to shape the emitted light into a usable angle.

Figure 7:
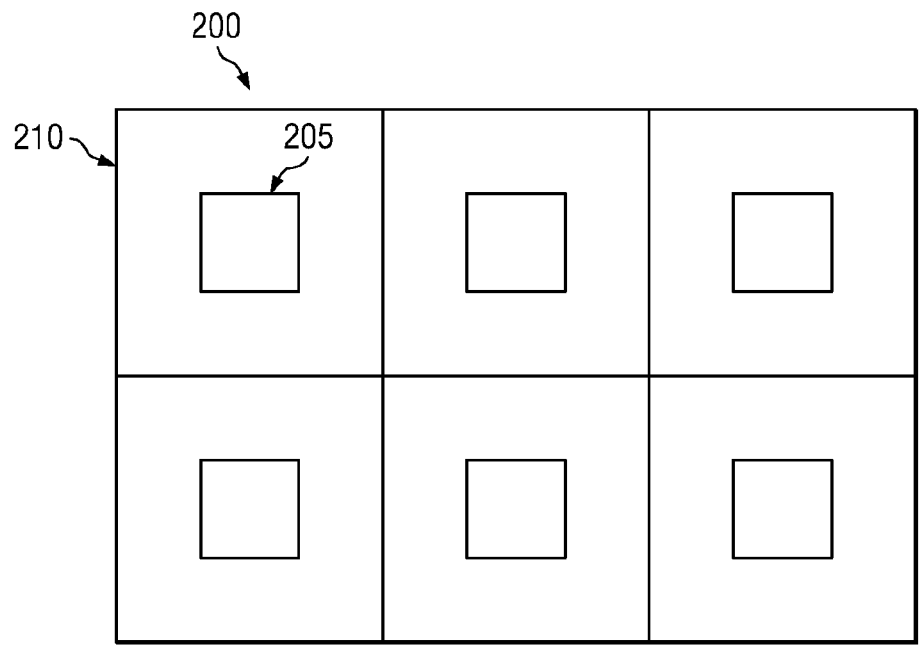
FIG. 7 is a diagrammatic representation of one embodiment of an array of separate optical devices.

Another advantage provided by embodiments of the present invention is that multiple separate optical devices can be easily arranged into an array that provides light in a desired angle (e.g., into an f/1 cone) with a substantially uniform intensity distribution. FIG. 7 shows one example of a view of an array of separate optical devices 200. The footprint of the entrance surfaces and exit surfaces of the separate optical devices are shown (e.g., entrance surface 205 and exit surface 210). One advantage of using an array of separate optical devices (and corresponding array of LEDs) is that the separate optical devices making up array 200 can be shorter in height than a single separate optical device having the same combined exit surface area and entrance surface area. Consequently, the same amount of light can be transmitted with the same half angle using a smaller amount of overall volumetric space. Furthermore, such a system may be more efficient overall because smaller LEDs tend to be more efficient than larger LEDs (i.e., an array of smaller LEDs can be more efficient than a larger LED with the same light emitting surface area). Arrays of LEDs with corresponding separate optical devices can be arranged to light large areas or long linear surfaces.

Embodiments of the present invention can be used in a variety of applications. One potential application is in a digital light processing ("DLP") system. In many DLP systems, the DLP chip has an acceptance angle of somewhere between 10 and 12 degrees half angle. The area of the chip multiplied by the acceptance angle sets the etendue of the system. A lighting system that does not match this etendue is wasting light. In previous systems using CPCs, light from an array of multiple LEDs is directed through dichroic filters, to a condenser optic, to an integrating tunnel, to an imaging relay objective and then to the cone. The integrating tunnel is needed to create uniform output.

Figure 8:
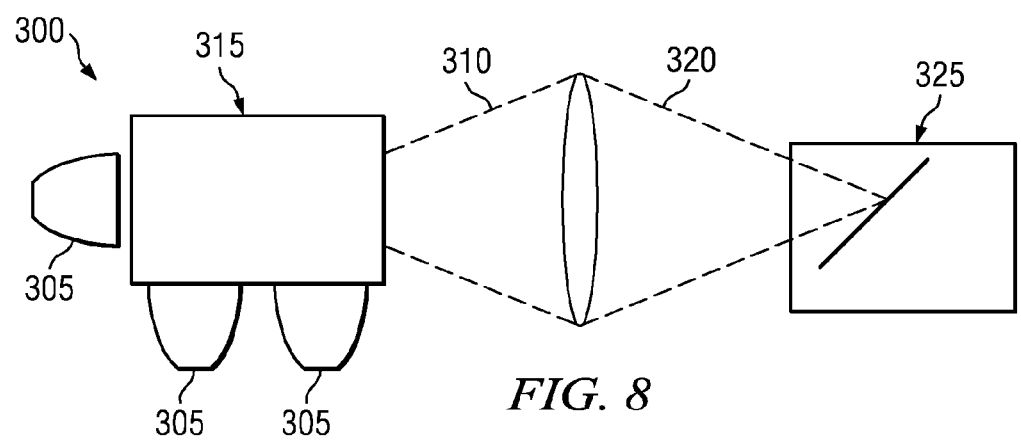
FIG. 8 is a functional diagrammatic representation of a DLP system.

FIG. 8, on the other hand, is a functional diagrammatic representation of a DLP system 300 using separate optical devices combined with LEDs (illustrated together as 305) according to embodiments of the present invention. Assume the DLP system uses three arrays of 12 LEDs each (12 green LEDs, 12 red LEDs and 12 blue LEDs) (the separate optical devices combined with LEDs are represented generally at 305 and not all are shown for the sake of simplicity). Each LED can have an individual separate optical device. For a DLP system using separate optical devices and LEDs 305 according to the present invention rather than CPCs with LEDs, uniform light in the desired f/1 cone (represented at 310) can be projected through the dichroic filters 315 directly to the imaging relay optic 320 and then to DLP chip 325 within the specified acceptance angle. Moreover, the separate optical devices can be shaped so that the projected light has a preferred aspect ratio, such as 4:3, while conserving luminance. This has at least two advantages. First, space is saved because separate optical devices 305 can be generally smaller than CPCs and the distance of the transmission path is smaller as the condenser optic and integrating tunnel are no longer needed. Moreover, the efficiency of the system is increased as there are no light losses due to the condenser optic and integrating tunnel.

As with DLP system 300, separate optical devices according to various embodiments of the present invention can be used with secondary condensing lenses at the exit face of the separate optical device or away from the exit face of the separate optical device. According to one embodiment, when the condenser lens is away from the exit face of the separate optical device, the focal plane of the condenser lens can be approximately at the exit face of the separate optical device. The condenser lens can be a fresnel lens of TIR and/or refraction design, or other condenser lens. The combination of separate optical device and condenser lens allows the ability to take a Lambertian source with a broad emission solid angle ($\pi$ steradians) and convert it into a narrow solid angle (on the order of 0.1 steradians or less) while conserving radiance of the system and doing so in a very small volume.

Another potential application for embodiments of the present invention is cell phone display lighting. Present systems typically use three side-emitting blue LEDs with phosphor-filled encapsulant material to generate white light. The sides of the LED are typically opaque and a large percentage of the light generated is absorbed by the sidewalls. This results in over 50% of the light being lost to absorption. In addition, the index change at the interface of the encapsulant to air creates a TIR condition for exit rays striking the interface at greater than the critical angle. This results in approximately 44% loss at the interface. Separate optical devices, according to various embodiments of the present invention, on the other hand, can deliver up to 95% of the generated light to the light guide, resulting in very large system brightness improvements.

Phosphors and other materials including nanoparticles of various materials (collectively referred to simply as "phosphors" herein) are commonly used in conjunction with various colors of LEDs to produce white light. According to various embodiments, the LED may also be coated with a phosphor layer between the LED and the separate optical device; or, a phosphor layer can be present between the separate optical device and the subsequent optical element, such as a light guide; or, a phosphor coating may be imbedded in the material of the separate optical device; or, other embodiments of phosphor layering as well. In the first case, all rays from the phosphor-coated LED can be delivered to the light guide. In the second case, all rays from the LED can be delivered to the phosphor layer, and light rays backscattered from the phosphor layer can be recycled. In the third embodiment, light scattered from the phosphor is recycled back in one direction and gets refracted back to the light guide in the other direction. Other embodiments present similar opportunities for capturing and recycling scattered light from the phosphor.

Another potential application for embodiments of separate optical devices is use as a cell phone camera flash. Present systems typically use LEDs with Gaussian energy distributions that produce a very bright area in the center of the image and dark areas at the edges, causing uneven lighting of the subject matter. Moreover, the beam shape of present flash units is circular, while the image captured by the CCD camera is rectangular. Additionally, the index of refraction change at the interface of the encapsulant to air creates a TIR condition for exit rays striking the interface at greater than the critical angle. This results in losses at the interface that are a function of the exit solid angle. Separate optical devices according to embodiments of the present invention, on the other hand, can deliver a rectangular or square flash, with 95% of the light received by the separate optical device from the LED being provided to the image area in a uniform distribution. This results in more uniform scene illumination and higher levels of illumination from the same LED as used in traditional systems.

Another potential application for separate optical devices according to embodiments of the present invention is for liquid crystal display ("LCD") backlighting. Traditional LCD systems use a linear array of red, green and blue LEDs. The light from the LEDs is directed into a mixing light guide to provide uniformity of color and intensity. Typically, the LEDs have a dome placed over the LED and light is captured by elliptical reflectors to direct the light to the light guide. While elliptical reflectors work well for point sources, LEDs are not point sources and some of the rays will not get to the focii inside the light guide (approximately 20% of the light is lost). Moreover, since some light from a dome encapsulant is emitted at greater than 180 degrees, some of the light (again, approximately 20%) is absorbed by the substrate, PCB board and other components. Furthermore, because the dome is large with respect to the size of the cavity in the dome, a certain percentage of light typically gets refracted (typically around 10%). Though all these losses are relatively small, they are multiplicative. Thus, only about 57% of the light originally emitted from the LED actually gets to the light guide.

Separate optical devices according embodiments of the present invention, on the other hand, can provide up 96% of the light received from the LEDs (e.g., red, green and blue LEDs) to the light guide (assuming about 4% fresnel losses) in the desired cone angle. Consequently, lower power LEDs can be used to achieve the same results as are possible in current systems or more light can be delivered at the same power consumption level. Indeed, in some embodiments, the light guide may not be required and arrays of LEDs with separate optical devices may be used to directly backlight LCDs.

For lighting purposes (e.g., for LCDs or other applications), red, green and blue LEDs can be used to produce white or other color balanced light as is known in the art. An array of LEDs (e.g., one red, one blue and two green or other combinations) and corresponding separate optical devices can be used to produce white or color balanced light for illumination. According to other embodiments, a single separate optical device can be coupled to an array of multiple LEDs to produce white light. For example, a single separate optical device can be used for a tightly spaced array having one red, one blue and two green LEDs to produce white and color balanced light.

Another potential use for separate optical devices according to various embodiments of the present invention is in car headlights, flashlights and other devices. The various parameters of the separate optical devices can be selected to provided the desired projection cone and beam profile.

Figure 9:
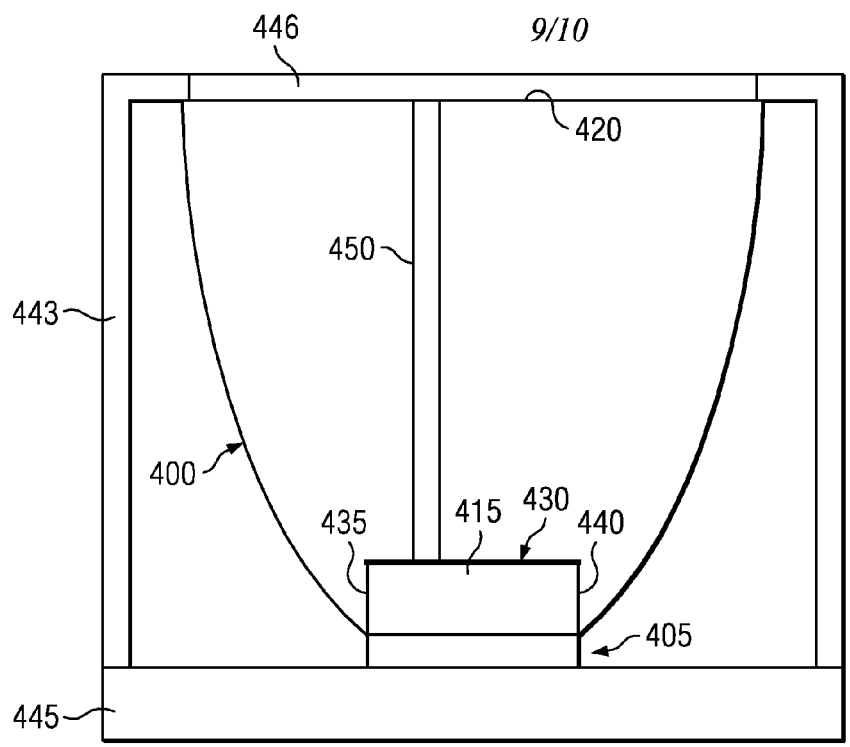
FIG. 9 is a diagrammatic representation of another embodiment of a separate optical device.

FIG. 9 is a diagrammatic representation of another embodiment of a separate optical device 400 in which separate optical device 400 extends down the sides of LED 405, which fits in a cavity or empty volume defined at the bottom of separate optical device 400. The advantage of extending down all or a portion of the sides of LED is that light rays that would be lost due to TIR in LED sapphire layer 415 at the sapphire/air interface may now enter separate optical device 400. These rays can be reflected by the sidewalls of separate optical device 400 to exit interface 420 as described above (e.g., by shaping the sidewalls to cause TIR). When the sides of LED 405 also become an emitting surface, $A_1$ and $A_2$ of separate optical device 400 can be calculated to consider the sides in addition to the top surface of LED 405 (i.e., $A_1$ will include the surface areas of entrance surface 430, 435, 440 and other entrance surfaces, not shown). According to other embodiments, $A_1$ can simply be considered for entrance surface 430 and the size of $A_2$ calculated and then adjusted slightly to account for the additional light entering entrance surfaces 435, 440 and other entrance surfaces.

Separate optical device 400 can be coupled to LED 405 using a polymer or other material that has a similar or identical IOR as separate optical device 400. When separate optical device 400 is placed over LED 405, the polymer or other material can act to completely fill the air spaces between separate optical device 400 and LED 405. If excess material is pressed out from the joint of the separate optical device 400 and LED 405, the material can be removed while still fluid to retain the shape of light directing sidewall surfaces of separate optical device 400.

Separate optical device 400 may be substantially larger than LED 405. Consequently, additional support may be required to secure it against vibration, shock and external force. Accordingly, a mechanical attachment device 443 (e.g., of molded plastic, metal or other material) can contact exit face 420 or other parts of separate optical device 400 and attach to supporting structure 445 or the PCB board to create a normal force to keep separate optical device 400 seated against LED 405. Sideways motion can be prevented by frictional force between attachment device 443 and exit face 420 or by other forces between attachment device 443 and separate optical device 400. Preferably, attachment device 443 has the same IOR as separate optical device 400 so that rays exiting separate optical device 400 are not deviated as they pass through attachment device 400. In one embodiment, separate optical device 400 and attachment device 430 can be a single piece, but in other embodiments they can be separate pieces and have different IORs. If attachment device 430 and separate optical device 400 are separate, they can include interlocking locating features such as bumps or ridges for more secure and accurate alignment of the devices. An attachment device 443 can be used in lieu of or in addition to bonding. Attachment device 443 can include a face 446 such as a lens, layer of material or other face through which light exiting exit surface 420 passes. Consequently, attachment device can additionally act to shape or further define the output beam. Though attachment device 443 is shown illustratively in FIG. 9 (which shows one embodiment of separate optical device 400 with a cavity into which LED 405 fits), attachment device 443 may also be used in conjunction with other embodiments of the separate optical device and LED, including but not limited to the embodiment shown in FIG. 1 (i.e., a flat-bottomed separate optical device 10 being coupled directly to an LED 15).

In some cases it can be desirable to have a phosphor (or other material layer) to create white light from LED 405. According to one embodiment, a layer of phosphor can be coated on entrance surfaces 430, 435 and 440 prior to separate optical device 400 being placed over LED 405. According to other embodiments, a phosphor layer can coat exit surface 420 or be embedded in any plane of separate optical device 400 or, as noted above, the phosphor layer can be part of attachment device 443. According to yet another embodiment, a phosphor layer can be external to separate optical device 400 with an air gap between exit surface 420 and the phosphor layer. The sidewalls of separate optical device 400, in this case, can be designed so that light scattered back from the phosphor layer reenters separate optical device 400 and is partially or fully recycled.

In other cases, the phosphor can be in the bonding polymer. Separate optical device 400 can have a passage 450 running from entrance surface 430 to exit surface 420. Separate optical device 400 can be placed over LED 405 with enough space for an amount of material to be injected. This material, such as a polymer infused with phosphor, can be injected through flow passage 450 to bond separate optical device 400 to LED 405. A clear polymer, or material similar to the material used for the majority of separate optical device 400, can then be injected into flow passage 450 to make separate optical device 400 solid (i.e., to fill flow passage 450).

Figure 10:
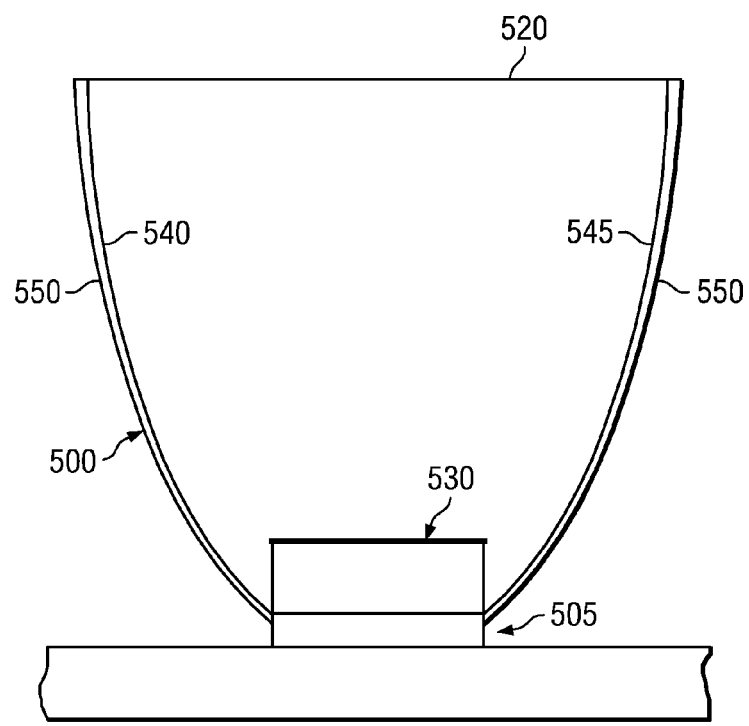
FIG. 10 is a diagrammatic representation of yet another embodiment of a separate optical device.

While, as discussed above, the sidewalls of a separate optical device (e.g., separate optical device 10 and separate optical device 400) can be shaped so that light incident on the inner surface of the sidewalls is reflected to the exit surface due to TIR, other embodiments can rely on reflection by a reflector. FIG. 10 is a diagrammatic representation of one embodiment of a separate optical device 500 coupled to an LED 505. Separate optical device 500 includes an exit surface 520 and an entrance surface 530. In the example of FIG. 10, the sidewalls of separate optical device 500 (e.g., sidewall 540 and sidewall 545) can include a reflective coating 550 that can be formed of any suitable reflective material such as nickel or aluminum. The sidewall shapes can be selected to rely on reflection from reflective coating 550 to reflect all or most rays incident on the sidewalls to exit surface 520. While there may be some losses due to absorption that would not be present using TIR, the use of a reflective coating may be less complex from a manufacturing standpoint. Additionally, using reflective surfaces eliminates the need to have the rays strike the sidewalls at angles greater than the critical angle, allowing more freedom in the design of the sidewall shapes.

Figure 11:
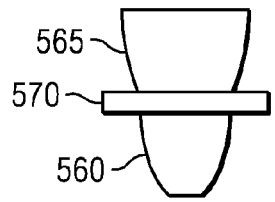
FIG. 11 is a diagrammatic representation of one embodiment of stacked separate optical devices.

In some applications, stacked separate optical devices can be used. FIG. 11 is a diagrammatic representation of one embodiment of stacked separate optical devices including separate optical device 560 and separate optical device 565. According to one embodiment, a layer of phosphor (or other material as previously discussed) can be disposed between the exit surface of separate optical device 560 and the entrance surface of separate optical device 565. Layer of phosphor 570 can include, for example, a layer of a polymer material imbedded with phosphor. The polymer material can extend beyond the edges of the exit surface of separate optical device 560 and include attachment mechanism (e.g., legs or other mechanisms) that can attach to PCB, a supporting substrate or other base. In this case, the layer of polymer material is part of an attachment device, such as that described above. In other embodiments, other types of material or no material is disposed between the separate optical devices.

According to one embodiment, separate optical device 560 can have a higher IOR and separate optical device 565 can have a lower IOR, or vice versa. In other embodiments, separate optical device 565 and separate optical device 560 can have the same IOR.

Figure 12:
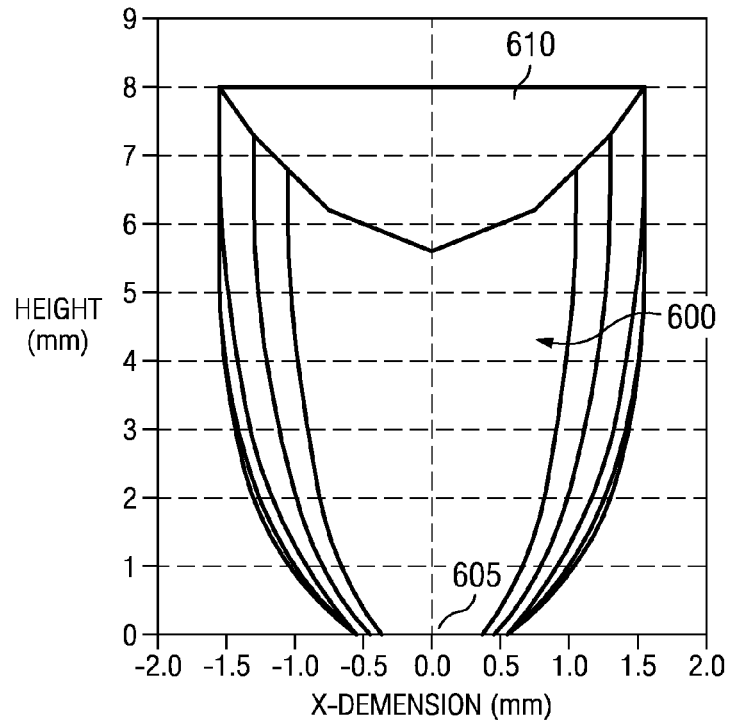
FIG. 12 is a diagrammatic representation of still another embodiment of a separate optical device.
Figure 12:
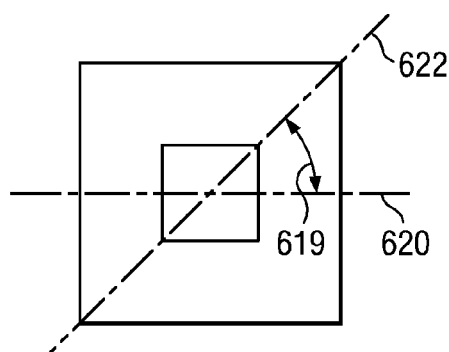

FIG. 12 is a diagrammatic representation of another embodiment of a separate optical device 600. For separate optical device 600, the height (the distance between entrance surface 605 and exit surface 610) varies depending on the skew angle $\theta_s$ 619 of the cross section at that point. $\theta_s=0$ corresponds to a cross section taken across the separate optical device from the middle of one side to the middle of the opposite side. This is represented at 620 while a skew angle of 45 degrees is represented at 622. According to one embodiment the maximum height for a square separate optical device (e.g., determined as described above) occurs at the cross sections having $\theta_s=45+/-n*90$ degrees where n is an integer. In other words, the maximum height occurs at the diagonals (represented at 622). The minimum height occurs at $\theta_s=0+/-n*90$. Other embodiments of variable height separate optical devices can also be formed.

Separate optical devices can be formed in a variety of manners. For example, an array of partially completed separate optical devices comprising the sidewalls and end surface defining a cavity can be molded in a continuous array (e.g., appearing similar to an egg crate). This can be done, for example, by injection molding. The array can then be placed over a corresponding array of LEDs and the volume inside the cavities filled with dielectric material. The sidewalls of the array optionally can be coated with a reflective material. In another embodiment, the array can be formed by vacuum forming of a thermoplastic sheet, draw-die forming of a metallic sheet (which may be the reflective coating the completed separate optical device) or other suitable method known or developed in the art. Again, the array can be placed over the corresponding LEDs and the cavities filled with dielectric material to complete the separate optical device.

In the above embodiments, the separate optical devices are molded in place on top of the LED, but separately from the LED. In another embodiment, the separate optical device can be pre-molded apart from the LED using conventional molding or other techniques. In this case, the separate optical device can include a cavity to receive the LED. The LED and separate optical device, as described above, can be bonded together using a polymer or other bonding agent, can be held together using an attachment device or can otherwise be placed in operational relationship to each other.

While the present invention has been described with reference to particular embodiments, it should be understood that the embodiments are illustrative and that the scope of the invention is not limited to these embodiments. Many variations, modifications, additions and improvements to the embodiments described above are possible. For example, the various ranges and dimensions provided are provided by way of example and optical devices according to the present invention may be operable within other ranges using other dimensions. It is contemplated that these variations, modifications, additions and improvements fall within the scope of the invention as detailed in the following claims.

What is claimed is:

1. A separate optical device operable to couple to a separate LED, the separate optical device comprising:

an entrance surface to receive light from an LED;

an exit surface opposite from and a distance from the entrance surface, wherein the exit surface has an area that is within 10% of a minimum area necessary to fully conserve radiance for a selected half-angle;

a set of sidewalls, wherein each sidewall has a plurality of sections, each section based on a different curve and adapted to reflect light having a straight transmission path to that section in a corresponding angular sub-tense to the exit surface so that the light is incident on the exit surface at less than or equal to the critical angle at the exit surface and wherein the separate optical device is shaped to emit at least 70% of the light entering the separate optical device through the entrance surface from the exit surface in a uniform distribution pattern in the selected half angle.

2. The separate optical device of claim 1, wherein the exit surface has the minimum area necessary to conserve brightness for the desired half-angle of light emitted from the separate optical device.

3. The separate optical device of claim 1, wherein the exit surface has an area that is at least equal to and within 10% of a minimum area equal to $$\frac{\Phi_2 n_1^2 A_1 \Omega_1}{\Phi_1 n_2^2 \Omega_2}$$

wherein $\Phi_1$ is the light flux entering the entrance surface, $\Phi_2$ is the light flux exiting exit surface, $\Omega_1$ is the effective solid angle whereby light enters the entrance surface, $\Omega_2$ is the effective solid angle whereby light leaves exit surface; $A_1$ is the area of the entrance surface, $n_1$ is the refractive index of material of the separate optical device and $n_2$ is the refractive index of the substance external to the separate optical device.

4. The separate optical device of claim 1, wherein the separate optical device is shaped to emit from the exit surface at least 80% of the light entering the separate optical device through the entrance face.

5. The separate optical device of claim 1, wherein each section reflects light through total internal reflection.

6. The separate optical device of claim 1, wherein the separate optical device is formed of a single piece of solid material.

7. The separate optical device of claim 1, wherein the entrance surface and exit surface have the same shape and aspect ratio as the LED.

8. The separate optical device of claim 1, wherein the exit surface is parallel to and rotationally aligned with the entrance surface.

9. The separate optical device of claim 1, wherein the entrance surface is square.

10. The separate optical device of claim 1, wherein the separate optical device is configured to output a substantially square and uniform beam of light in the selected half angle.

11. The separate optical device of claim 1, wherein the separate optical device is shaped to project at least 70% of the light entering the entrance surface of the separate optical device from the exit surface with a half angle of between 10 to 60 degrees.

12. The separate optical device of claim 1, wherein the separate optical device is configured to output a substantially square and uniform beam of light in the selected half angle.

13. An optical system comprising:
   an LED having an emitting surface; and
   a separate optical device comprising an entrance surface, an exit surface and a set of sidewalls running from edges of the entrance surface to edges of the exit surface, wherein:
      the exit surface is opposite from and a distance from the entrance surface, wherein the exit surface has an area that is within 10% of a minimum area necessary to fully conserve radiance for a selected half-angle of light;
      each sidewall has a plurality of sections, each section based on a different curve and adapted to reflect light having a straight transmission path to that section in a corresponding angular sub-tense to the exit surface so that the light is incident on the exit surface at less than or equal to the critical angle at the exit surface; and
   the separate optical device is shaped to emit from the exit surface at least 70% of the light entering the separate optical device through the entrance surface from the exit surface in a uniform distribution pattern in the selected half angle.

14. The optical system of claim 13 further comprising:
   a phosphor layer disposed between an emitting surface of the LED and the entrance surface of the separate optical device.

15. The optical system of claim 13, wherein the phosphor layer is selected to produce white light.

16. The optical system of claim 13, wherein the entrance surface is square.

17. The optical system of claim 13, wherein the separate optical device is shaped to emit from the exit surface at least 80% of the light entering the separate optical device through the entrance face.

18. The optical system of claim 13, wherein each section reflects light through total internal reflection.

19. The optical system of claim 13, wherein the separate optical device is formed of a single piece of solid material.

20. The optical system of claim 13 comprising an array of LEDs and corresponding separate optical devices.

* * * * *